United States Patent
Hasegawa et al.

(10) Patent No.: US 11,641,554 B2
(45) Date of Patent: May 2, 2023

(54) TRANSDUCER AND MANUFACTURING METHOD THEREOF

(71) Applicant: Sumitomo Riko Company Limited, Aichi (JP)

(72) Inventors: Koichi Hasegawa, Aichi (JP); Shinya Tahara, Aichi (JP); Katsuhiko Nakano, Aichi (JP); Masaki Nasu, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 0 days.

(21) Appl. No.: 17/668,334

(22) Filed: Feb. 9, 2022

(65) Prior Publication Data

US 2022/0167094 A1 May 26, 2022

Related U.S. Application Data

(63) Continuation of application No. 16/817,643, filed on Mar. 13, 2020, now Pat. No. 11,265,658, which is a (Continued)

(30) Foreign Application Priority Data

Nov. 30, 2017 (JP) .............................. JP2017-229920
Sep. 25, 2018 (JP) .............................. JP2018-178216
(Continued)

(51) Int. Cl.
*H04R 19/00* (2006.01)
*B06B 1/02* (2006.01)
(Continued)

(52) U.S. Cl.
CPC ........... *H04R 19/00* (2013.01); *B06B 1/0292* (2013.01); *B29C 66/73921* (2013.01); (Continued)

(58) Field of Classification Search
CPC .......... H04R 19/00; H04R 1/06; H04R 31/00; H04R 2307/025; H04R 2307/027; (Continued)

(56) References Cited

U.S. PATENT DOCUMENTS

| | | | |
|---|---|---|---|
| 11,265,658 B2 * | 3/2022 | Hasegawa | B06B 1/0292 |
| 2009/0035530 A1 * | 2/2009 | Speich | G06K 19/07749 |
| | | | 428/190 |
| 2013/0233278 A1 * | 9/2013 | Sato | H01L 41/0472 |
| | | | 123/456 |

* cited by examiner

*Primary Examiner* — Angelica M McKinney
(74) *Attorney, Agent, or Firm* — JCIPRNET

(57) ABSTRACT

A transducer in which electrical connections between electrode sheets and leading wires can be secured via an approach other than soldering or welding is provided. In a sheet body portion, a dielectric layer and a first electrode sheet are joined by a first main fusion layer formed of a fusion material. A first conductive portion of a first leading wire is fixed to the sheet body portion by a first clamp. The first clamp includes a plurality of first leg portions that penetrates the sheet body portion in a thickness direction, a first coupling portion that couples the proximal ends of the plurality of first leg portions and is disposed across the first conductive portion, and a plurality of first bent-back portions that is formed by bending the respective distal ends of the plurality of first leg portions and is locked with a second surface of the sheet body portion.

11 Claims, 16 Drawing Sheets

Related U.S. Application Data continuation of application No. PCT/JP2018/044267, filed on Nov. 30, 2018.

(30) Foreign Application Priority Data

Sep. 27, 2018 (JP) .............................. JP2018-181451
Nov. 29, 2018 (JP) .............................. JP2018-223155

(51) Int. Cl.
*B29C 65/00* (2006.01)
*H04R 31/00* (2006.01)
*H04R 1/06* (2006.01)

(52) U.S. Cl.
CPC ................ *H04R 1/06* (2013.01); *H04R 31/00* (2013.01); *H04R 2307/025* (2013.01); *H04R 2307/027* (2013.01); *H04R 2307/029* (2013.01)

(58) Field of Classification Search
CPC .......... H04R 2307/029; H04R 2231/00; B06B 1/0292; B29C 66/73921; H01L 29/84
See application file for complete search history.

TRANSDUCER AND MANUFACTURING METHOD THEREOF

CROSS-REFERENCE TO RELATED APPLICATIONS

This application is a continuation application of an application serial of Ser. No. 16/817,643, filed on Mar. 13, 2020, which is a continuation application of International Application number PCT/JP2018/044267, filed on Nov. 30, 2018 and claims the priority benefit of Japan Patent Application No. 2017-229920 filed on Nov. 30, 2017, Japan Patent Application No. 2018-178216 filed on Sep. 25, 2018, Japan Patent Application No. 2018-181451 filed on Sep. 27, 2018, and Japan Patent Application No. 2018-223155 filed on Nov. 29, 2018. The entirety of each of the above-mentioned patent applications are hereby incorporated by reference herein and made a part of this specification.

BACKGROUND

Technical Field

The present disclosure relates to a transducer and a manufacturing method thereof.

Related Art

In patent literature 1, a configuration is disclosed in which a leading wire is connected by soldering or welding to a free end of a wire-mesh-shaped external electrode in a multilayer piezo-actuator. In patent literature 2, a configuration is disclosed in which a leading wire is electrically connected to an end of an external electrode in a multilayer piezoelectric element by an electrically conductive joining material such as a solder, an electrically conductive resin or the like and a connection portion between the end of the external electrode and the leading wire are covered by resin.

In patent literature 3, a piezoelectric element in which a porous sheet-shaped electrode is embedded in a polymer piezoelectric body is disclosed. This piezoelectric element is manufactured by treating the surface of a polymer piezoelectric film or sheet with an organic solvent such as acetone or the like and then laminating and crimping the porous sheet-shaped electrode on the treated surface.

LITERATURE OF RELATED ART

Patent Literature

Patent literature 1: Japanese Patent No. 2012-500486
Patent literature 2: Japanese Patent No. 5465337
Patent literature 3: Japanese Patent No. 3105645

In patent literatures 1 and 2, the leading wire is not connected to the electrode sheet that functions as a transducer but connected to the external electrode extended to the outside. If the leading wire can be brought into direct contact with the electrode sheet instead of the external electrode, cost reduction of the transducer can be achieved.

Although the electrode sheet deforms along with the deformation of the entire transducer, the leading wire and the electrode sheet need to maintain an electrically connected state even in this case. Particularly when the electrode sheet is in a shape of having through holes, it is not sufficient if the leading wire and the electrode sheet are joined by merely soldering or welding, and thus application of a more reliable joining method is one of the problems.

Furthermore, the heating temperature of soldering or welding needs to be below the heat resistance temperature of the electrode sheet. For example, it is known that an electrode sheet is formed by plating the surface of a resin fiber such as polyethylene with an electrically conductive material such as copper or nickel. In this electrode sheet, because the melting temperature of the resin is particularly low, the heating temperature of soldering or welding needs to be below the melting temperature.

On the other hand, a lead-free solder is used because of environmental problems in recent years, but the melting temperature of the lead-free solder is high. Since the range of the heating temperature that satisfies both conditions is narrow, it is not easy to improve the electrical connection between the electrode sheet and the leading wire. Therefore, it is one of the problems to secure the electrical connection between the electrode sheet and the leading wire by an approach different from soldering or welding.

In addition, in recent years, suppression of emission of volatile organic compounds (VOC) is required as an environmental measure. Therefore, it is required not to use a volatile adhesive and also not to use an organic solvent.

Furthermore, unlike a structure using a piezoelectric effect, a transducer using an electrostatic capacitance between electrodes has been noticed. The electrostatic transducer has a different electrostatic capacitance depending on the dielectric material. Assume that the dielectric surface of the polymer is treated with an organic solvent and the electrode is crimped, components of the organic solvent remain at the crimped site. The remaining components of the organic solvent may affect the electrostatic capacitance. As a result, there is a risk that an electrostatic capacitance as designed cannot be obtained due to the effect of the remaining components of the organic solvent.

In addition, the electrostatic transducer is required to have not only flexibility but also stretchability in order to enable attachment to various sites. For example, when an attachment object has various shapes like a free-form surface and the transducer manufactured into a flat-surface shape is attached along the surface of the attachment object, the flexibility and the stretchability are very important factors for the transducer. Without flexibility or stretchability, the transducer cannot be neatly attached to the attachment object of free-form surface.

Then, as described above, when a volatile adhesive or an organic solvent is used, the components of the volatile adhesive or the organic solvent may affect the flexibility and the stretchability of the transducer. Therefore, from the viewpoint of flexibility and stretchability, it is also required not to use a volatile adhesive or an organic solvent. Therefore, for the various reasons described above, it is one of the problems that the electrostatic transducer can be manufactured without using a volatile adhesive or an organic solvent.

In addition, at a site where the leading wire is connected to the electrode, the leading wire and the electrically conductive joining material connecting the leading wire protrude in a surface normal direction of the electrostatic sheet. Therefore, compared with the site at which the leading wire is not disposed, the thickness is increased at the site where the leading wire is disposed by a thickness of the leading wire and the electrically conductive joining material. Particularly, when a leading wire is disposed on each of both surfaces of the electrostatic sheet, the thickness is increased by a thickness twice that of the leading wire and the electrically conductive joining material. Therefore, thickness reduction at the site where the leading wire is disposed is one of the problems.

In addition, it is useful to integrally embed the electrode sheet in the dielectric layer in the electrostatic transducer. However, as in patent literature 3, it is not easy to electrically connect the leading wire to the electrode sheet in the state that the electrode sheet is embedded. Therefore, it is one of the problems to facilitate electrical connection between the electrode sheet and the leading wire.

SUMMARY

The present disclosure provides a transducer and a manufacturing method thereof, with which it is possible to manufacture the transducer without using a volatile adhesive or an organic solvent and secure electrical connection between the electrode sheet and the leading wire by an approach different from soldering or welding.

One of the transducers of the present disclosure includes a sheet body portion constituting an electrostatic transducer, a first leading wire disposed on a first surface side of the sheet body portion, and a first clamp which fixes the first leading wire to the sheet body portion.

The sheet body portion includes: a dielectric layer; a first electrode sheet which includes a plurality of first through holes, is disposed on a first surface side of the dielectric layer, and is disposed in a state that at least a part is exposed from the first surface of the dielectric layer; and a first main fusion layer which is formed of a fusion material, is disposed as at least a part of the dielectric layer on the first surface side within the dielectric layer or joined as a separate member to the first surface of the dielectric layer, and joins the dielectric layer and the first electrode sheet by fusion of the fusion material.

The first leading wire includes a first conductive portion disposed in contact with the exposed surface of the first electrode sheet. The first clamp includes: a plurality of first leg portions which penetrates the sheet body portion in the thickness direction and in which the first surface side of the sheet body portion is set as a proximal end and the second surface side of the sheet body portion is set as a distal end; a first coupling portion which couples the proximal ends of the plurality of first leg portions and is disposed across the first conductive portion of the first leading wire, and interposes the first conductive portion of the first leading wire between the first coupling portion and the exposed surface of the first electrode sheet; and a plurality of first bent-back portions which is formed by bending from the respective distal ends of the plurality of first leg portions and is locked with the second surface of the sheet body portion.

DESCRIPTION OF THE EMBODIMENTS

According to the transducer, the dielectric layer and the first electrode sheet are joined by fusion of the fusion material. The fusion material is not a volatile adhesive or an organic solvent, and thus the transducer can be manufactured without using a volatile adhesive or an organic solvent. Accordingly, it is possible to suppress the emission of VOC in the manufacture of the transducer. Here, when the first main fusion layer is configured using a part of the raw material of the dielectric layer as the fusion material, there is a case of using a fusion material other than the dielectric layer.

Furthermore, the first clamp fixes the first leading wire to the sheet body portion. In other words, the first leading wire is fixed to the sheet body portion without applying soldering or welding. Compared with soldering or welding, the first coupling portion of the first clamp can be made thinner. Accordingly, the thickness can be reduced at a site where the first leading wire is connected to the first electrode sheet.

1. Overall Configuration of Transducer 1 of First Example

A transducer 1 of a first example is described with reference to FIG. 1. The transducer 1 is an electrostatic transducer. In other words, the transducer 1 can function as an actuator that utilizes the change in electrostatic capacitance between electrodes to generate vibration, sound or the like. In addition, the transducer 1 can function as a sensor (external force detection sensor) that utilizes the change in electrostatic capacitance between electrodes to detect a pressing force or the like from the outside, and can also function as a sensor (contact or proximity sensor) that utilizes the change in electrostatic capacitance between electrodes to detect contact or proximity of an electrical conductor having a potential.

When the transducer 1 functions as an actuator, a voltage is applied to the electrodes, and thereby a dielectric deforms corresponding to the potential between the electrodes and vibration is generated along with the deformation of the dielectric. When the transducer 1 functions as an external force detection sensor, the electrostatic capacitance between the electrodes changes due to deformation of the dielectric caused by an input of external pressing force, vibration, sound or the like, and the pressing force from the outside is detected by detecting the voltage corresponding to the electrostatic capacitance between the electrodes. In addition, when the transducer 1 functions as a contact or proximity sensor, the electrostatic capacitance between the electrodes changes due to contact or proximity of the electrical conductor having a potential, and the contact or proximity of the electrical conductor is detected by detecting the voltage corresponding to the changed electrostatic capacitance between the electrodes.

Figure 1:
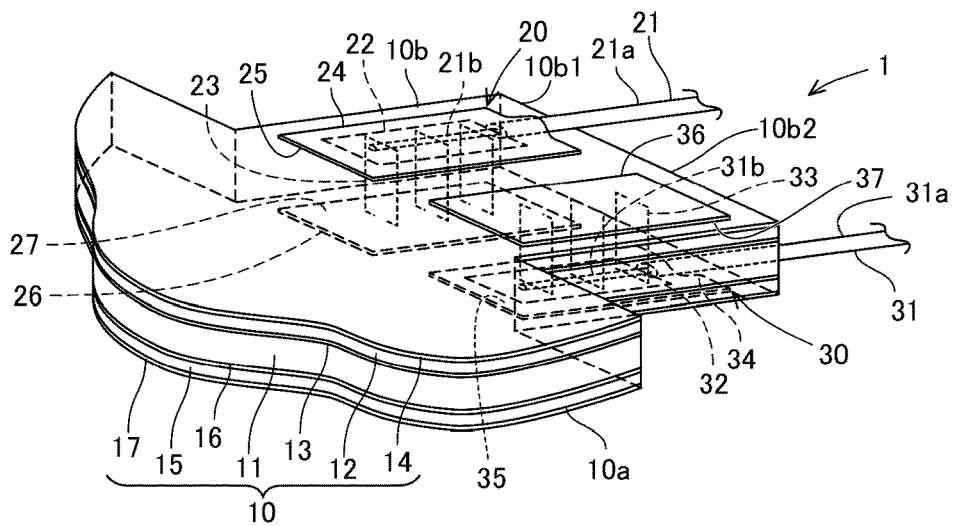
FIG. 1 is a perspective view showing an electrostatic sheet constituting a transducer 1 of a first example.

As shown in FIG. 1, the transducer 1 includes an electrostatic sheet formed in a sheet shape. However, the transducer 1 may also be formed by laminating a plurality of electrostatic sheets having the basic configuration shown in FIG. 1. The transducer 1 includes the electrostatic sheet configured by a sheet body portion 10, a first connection portion 20, and a second connection portion 30.

The sheet body portion 10 constitutes a main part for functioning as the electrostatic transducer 1. The sheet body portion 10 includes a transducer portion 10*a* constituting a range that functions as an actuator or sensor, and a terminal portion 10*b* connected to the edge of the transducer portion 10*a*. In this example, the terminal portion 10*b* includes a first terminal portion 10*b*1 and a second terminal portion 10*b*2. The sheet body portion 10 includes a dielectric layer 11, a first electrode sheet 12, a first main fusion layer 13, a first main protective layer 14, a second electrode sheet 15, a second main fusion layer 16, and a second main protective layer 17.

The first connection portion 20 includes a first leading wire 21, and constitutes a part that connects the first leading wire 21 to the sheet body portion 10. The first connection portion 20 includes at least the first leading wire 21, a first clamp 23, a first connection protective layer 24, and a first rear surface protective layer 26. In this example, the first connection portion 20 includes the first leading wire 21, a first fusion restriction layer 22, the first clamp 23, the first connection protective layer 24, a first connection fusion layer 25, the first rear surface protective layer 26, and a first rear surface fusion layer 27. That is, the first connection portion 20 may not include at least one of the first fusion restriction layer 22, the first connection fusion layer 25, and the first rear surface fusion layer 27.

The second connection portion 30 includes a second leading wire 31, and constitutes a part that connects the second leading wire 31 to the sheet body portion 10. The second connection portion 30 includes at least the second leading wire 31, a second clamp 33, a second connection protective layer 34, and a second rear surface protective layer 36. In this example, the second connection portion 30 includes the second leading wire 31, a second fusion restriction layer 32, the second clamp 33, the second connection protective layer 34, a second connection fusion layer 35, the second rear surface protective layer 36, and a second rear surface fusion layer 37. That is, the second connection portion 30 may not include at least one of the second fusion restriction layer 32, the second connection fusion layer 35, and the second rear surface fusion layer 37.

Besides, the transducer 1 may not include the elements related to the second electrode sheet 15. That is, the transducer 1 may not include the second electrode sheet 15, the second main fusion layer 16, the second main protective layer 17, the second leading wire 31, the second fusion restriction layer 32, the second clamp 33, the second connection protective layer 34, the second rear surface protective layer 36, or the second rear surface fusion layer 37. In this case, the electrostatic sheet constituting the transducer 1 includes the dielectric layer 11 and the elements related to the first electrode sheet 12. That is, the transducer 1 includes, as the sheet body portion 10, the dielectric layer 11, the first electrode sheet 12, the first main fusion layer 13, and the first main protective layer 14, and includes the first connection portion 20. Besides, the transducer 1 may also include an electrically conductive member (not shown) that corresponds to the second electrode sheet 15 and cannot deform.

2. Detailed Configuration of Sheet Body Portion 10

Next, the configuration of the sheet body portion 10 is described with reference to FIG. 2 and FIG. 3. The dielectric layer 11 is formed of a dielectric material capable of elastically deforming. Specifically, the dielectric layer 11 is formed of a thermoplastic material, particularly a thermoplastic elastomer. The dielectric layer 11 is formed in a sheet shape and a desired outer shape. The dielectric layer 11 has a structure that expands and contracts in the thickness direction and expands and contracts in the plane direction along with the expansion and contraction in the thickness direction.

The first electrode sheet 12 and the second electrode sheet 15 have electrical conductivity and also have flexibility and stretchability to the plane direction. The first electrode sheet 12 and the second electrode sheet 15 are, for example, electrically conductive cloth. The conductive cloth is a woven fabric or a non-woven fabric formed of an electrically conductive fiber. Here, the electrically conductive fiber is formed by coating the surface of a fiber having flexibility with an electrically conductive material. The electrically conductive fiber is formed, for example, by plating copper, nickel or the like on the surface of a resin fiber such as polyethylene or the like.

The first electrode sheet 12 includes a plurality of first through holes 12a and has flexibility and can expand and contract in the plane direction by forming the cloth using fibers. Similar to the first electrode sheet 12, the second electrode sheet 15 includes a plurality of second through holes 15a.

Figure 2:
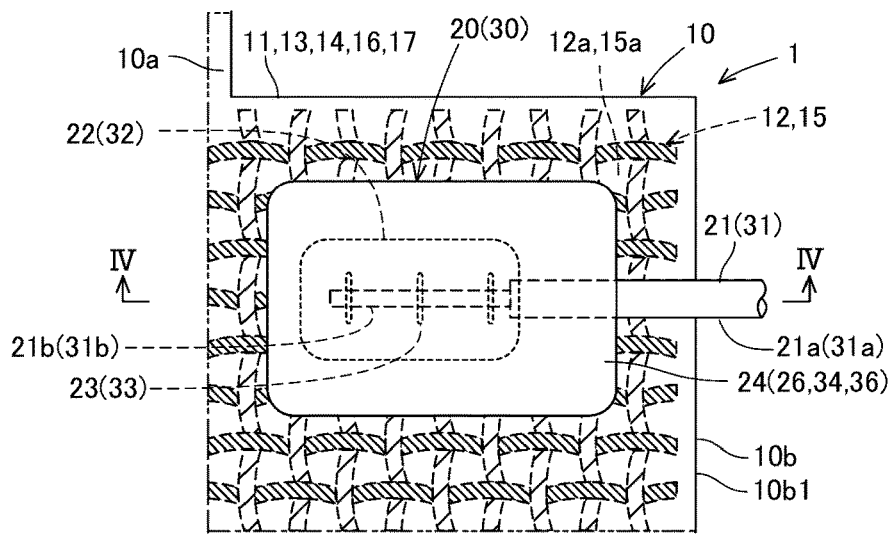
FIG. 2 is a plan view of the electrostatic sheet constituting the transducer 1 of the first example.
Figure 3:
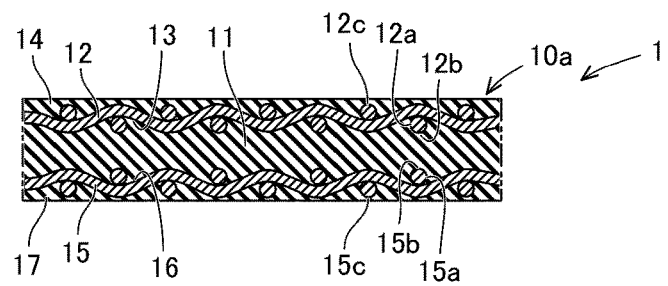
FIG. 3 is a cross-sectional view of a transducer portion 10a of the transducer 1 of the first example.

In FIGS. 2 and 3, the case in which the first electrode sheet 12 and the second electrode sheet 15 are electrically conductive woven fabrics is given as an example, but electrically conductive non-woven fabrics can also be applied. When the first electrode sheet 12 is, for example as shown in FIGS. 2 and 3, an electrically conductive woven fabric, the first electrode sheet 12 is formed by weaving electrically conductive fibers as warp and weft. A region surrounded by the warp and weft is the first through hole 12a. The same applies to the second through hole 15a in the second electrode sheet 15.

Besides, when the first electrode sheet 12 is an electrically conductive non-woven fabric, the first through holes 12a are irregularly formed. In addition, the first electrode sheet 12 and the second electrode sheet 15 can also use a thin-film punching metal, a metal cloth woven with metal yarn, and the like which have flexibility and stretchability, in addition to the electrically conductive cloth. In a case of the punching metal, the first through holes 12a and the second through holes 15a are sites punched out by punching. In addition, the first electrode sheet 12 can also use an elastomer sheet (including a rubber sheet) containing an electrically conductive material and having a plurality of through holes. Besides, in this example, the elastomer is a polymer material having elasticity and intends to include a rubber elastic body and an elastic body having a rubber shape other than the rubber elastic body.

The first electrode sheet 12 and the second electrode sheet 15 are formed with the same size and are formed in an outer shape similar to that of the dielectric layer 11. However, in the terminal portion 10b, the first electrode sheet 12 and the second electrode sheet 15 are formed in different shapes. The first electrode sheet 12 is disposed on a first surface (upper surface in FIG. 1) side of the dielectric layer 11. The second electrode sheet 15 is disposed on a second surface (lower surface in FIG. 1) side of the dielectric layer 11. Accordingly, as shown in FIG. 3, at least in the transducer portion 10a, the first electrode sheet 12 and the second electrode sheet 15 are disposed to face each other with the dielectric layer 11 sandwiched therebetween.

Here, as shown in FIG. 3, in the first electrode sheet 12, the surface on the side facing the second electrode sheet 15 is set as a first inner surface 12b, and the surface on the side opposite to the second electrode sheet 15 is set as a first outer surface 12c. In addition, in the second electrode sheet 15, the surface on the side facing the first electrode sheet 12 is set as a second inner surface 15b, and the surface on the side opposite to the first electrode sheet 12 is set as a second outer surface 15c.

As shown in FIG. 3, in the transducer portion 10a, the first electrode sheet 12 is disposed on the first surface side (upper side in FIG. 3) of the dielectric layer 11. In the first terminal portion 10b1, the first electrode sheet 12 is also disposed on the first surface side of the dielectric layer 11. However, in the first terminal portion 10b1, at least a part of the first electrode sheet 12 is disposed in a state of being exposed from the first surface of the dielectric layer 11. In addition, in the second terminal portion 10b2, the first electrode sheet 12 is not disposed.

As shown in FIG. 3, the first electrode sheet 12 and the dielectric layer 11 are joined by the first main fusion layer 13 formed of a fusion material. In FIG. 3, the first electrode sheet 12 is embedded on the first surface side of the raw material (not shown) of the dielectric layer 11. Here, in this example, the raw material of the dielectric layer 11 constitutes, in order from the second surface side, the raw material of the second main protective layer 17, the raw material of the second main fusion layer 16, the dielectric layer 11, the raw material of the first main fusion layer 13, and the raw material of the first main protective layer 14.

In other words, a part of the dielectric layer 11 on the first surface side functions as the first main fusion layer 13 that joins the main body portion of the dielectric layer 11 and the first electrode sheet 12. In other words, the first main fusion layer 13 is disposed as at least a part of the dielectric layer 11 on the first surface side, and joins the first electrode sheet 12 and the main body portion of the dielectric layer 11. Besides, the first main fusion layer 13 can also be joined as a separate member to the first surface of the dielectric layer 11 and join the first electrode sheet 12 and the dielectric layer 11.

In addition, as described above, the first electrode sheet 12 is embedded on the first surface side of the raw material of the dielectric layer 11. In other words, the first main fusion layer 13 joins a boundary site between the main body portion of the dielectric layer 11 and the first inner surface 12b of the first electrode sheet 12 and a boundary site between the main body portion of the dielectric layer 11 and the inner peripheral surface of the plurality of first through holes 12a of the first electrode sheet 12.

Furthermore, as shown in FIG. 3, the first main protective layer 14 covers the first outer surface 12c in a state of being joined to the first outer surface 12c of the first electrode sheet 12. A part on the first surface side of the raw material of the dielectric layer 11 functions as the first main protective layer 14. In other words, similar to the first main fusion layer 13, the first main protective layer 14 is disposed as a part on the first surface side of the raw material of the dielectric layer 11, and covers the first outer surface 12c by fusion of the fusion material. Besides, the first main protective layer 14 can also be disposed as a separate member on the first surface side of the dielectric layer 11 and cover the first outer surface 12c. Besides, the first outer surface 12c of the first electrode sheet 12 may be exposed to the outside.

In addition, as shown in FIG. 3, in the transducer portion 10a, the second electrode sheet 15 is disposed on the second surface side (lower side in FIG. 3) of the dielectric layer 11. In the second terminal portion 10b2, the second electrode sheet 15 is also disposed on the second surface side of the dielectric layer 11. However, in the second terminal portion 10b2, at least a part of the second electrode sheet 15 is disposed in a state of being exposed form the second surface of the dielectric layer 11. In addition, in the first terminal portion 10b1, the second electrode sheet 15 is not disposed.

As shown in FIG. 3, in the transducer portion 10a, similar to the first electrode sheet 12, the second electrode sheet 15 is embedded on the second surface side (lower side in FIG. 3) of the raw material of the dielectric layer 11. In other words, a part on the second surface side of the dielectric layer 11 functions as the second main fusion layer 16 that joins the main body portion of the dielectric layer 11 and the second electrode sheet 15. In other words, the second main fusion layer 16 is disposed as at least a part on the second surface side of the dielectric layer 11, and joins the second electrode sheet 15 and the main body portion of the dielectric layer 11 by fusion of the fusion material. Besides, the second main fusion layer 16 can also be joined as a separate member to the second surface of the dielectric layer 11 and join the second electrode sheet 15 and the dielectric layer 11 by fusion of the fusion material.

In addition, as described above, the second electrode sheet 15 is embedded on the second surface side of the raw material of the dielectric layer 11. In other words, the second main fusion layer 16 joins a boundary site between the main body portion of the dielectric layer 11 and the second inner surface 15b of the second electrode sheet 15 and a boundary site between the main body portion of the dielectric layer 11 and the inner peripheral surface of the plurality of second through holes 15a of the second electrode sheet 15.

Furthermore, the second main protective layer 17 covers the second outer surface 15c in a state of being joined to the second outer surface 15c of the second electrode sheet 15. A part on the second surface side of the raw material of the dielectric layer 11 functions as the second main protective layer 17. In other words, similar to the second main fusion layer 16, the second main protective layer 17 is disposed as a part on the second surface side of the raw material of the dielectric layer 11, and covers the second outer surface 15c by fusion of the fusion material. Besides, the second main protective layer 17 can also be disposed as a separate member on the second surface side of the dielectric layer 11 and cover the second outer surface 15c. Besides, the second outer surface 15c of the second electrode sheet 15 may be exposed to the outside.

Here, in FIG. 3, the first main fusion layer 13 and the second main fusion layer 16 are formed by applying heat to the raw material of the dielectric layer 11 formed of a thermoplastic elastomer. Therefore, the first main fusion layer 13 and the second main fusion layer 16 are configured by the same material components as the dielectric layer 11. In other words, the first main fusion layer 13 and the second main fusion layer 16 are formed without substantial change in the material components of the dielectric layer 11. It means that the first main fusion layer 13 and the second main fusion layer 16 do not contain components such as a volatile adhesive, an organic solvent, or the like.

In other words, in the sheet body portion 10, the dielectric layer 11 and the first electrode sheet 12 are joined by fusion of the fusion material. Since the fusion material is not a volatile adhesive or an organic solvent, the sheet body portion 10 can be manufactured without using a volatile adhesive or an organic solvent. Accordingly, it is possible to suppress the emission of VOC in the manufacture of the sheet body portion 10. In addition, the same applies to the joining between the dielectric layer 11 and the second electrode sheet 15.

3. Detailed Configuration of First Connection Portion 20

Next, the configuration of the first connection portion 20 is described with reference to FIGS. 2, 4, and 5. The first leading wire 21 includes a first leading wire body 21a that covers a conductive wire with an insulating material, and a first conductive portion 21b that is disposed on the distal end side and exposes the conductive wire.

The first leading wire body 21a of the first leading wire 21 is disposed on the side of a surface (first outer surface 12c) of the first electrode sheet 12 opposite to the dielectric layer 11. The first conductive portion 21b of the first leading wire 21 is formed of a stranded wire. In other words, the first conductive portion 21b is not a single wire but a bundle of a plurality of thin wires.

The first conductive portion 21b of the first leading wire 21 is disposed on the first surface side of the first terminal portion 10b1 of the sheet body portion 10, specifically, on the first surface side of the dielectric layer 11. More specifically, the first conductive portion 21b is disposed in contact with the exposed surface of the first electrode sheet 12. As shown in FIG. 3, the first conductive portion 21b may be disposed on the first outer surface 12c side of the first electrode sheet 12. In addition, although not shown, the first conductive portion 21b may also be entangled with the first electrode sheet 12. In either case, the first conductive portion 21b is electrically connected to the first electrode sheet 12.

The first fusion restriction layer 22 is formed in a sheet shape, and is formed of a material capable of restricting passage of the fusion material constituting the first main fusion layer 13. The first fusion restriction layer 22 is formed of a material having a softening point higher than that of the fusion material constituting the first main fusion layer 13. The material not having a softening point corresponds to the material having an infinite softening point. For example, the first fusion restriction layer 22 is formed of a resin sheet, a heat-resistant paper, or the like.

The first fusion restriction layer 22 is partially disposed between the first electrode sheet 12 and the first main fusion layer 13. Specifically, the first fusion restriction layer 22 is disposed in a region where the first leading wire 21 is disposed. Accordingly, the first fusion restriction layer 22 restricts the first main fusion layer 13 from being fused to the first electrode sheet 12 in the region where the first leading wire 21 is disposed. In other words, the first main fusion layer 13 does not exist in the central portion of the first fusion restriction layer 22. Accordingly, the first fusion restriction layer 22 exposes at least a part of the first electrode sheet 12 to the outside of the first main fusion layer 13 in the central portion.

Here, the central portion on the outer surface of the first fusion restriction layer 22 is not joined to the first main fusion layer 13 and is disposed on, without being joined, the first electrode sheet 12. On the other hand, the inner surface of the first fusion restriction layer 22 is joined to the first main fusion layer 13. However, the outer edge portion on the outer surface of the first fusion restriction layer 22 is joined to the first main fusion layer 13. In other words, the outer edge portion of the first fusion restriction layer 22 is embedded in the first main fusion layer 13. Accordingly, the first fusion restriction layer 22 is positioned by the first main fusion layer 13.

Accordingly, the first main fusion layer 13 is not joined to the first electrode sheet 12 in a region where the first fusion restriction layer 22 exists. Besides, the first main fusion layer 13 exposes the first electrode sheet 12 to the outside in the region where the first fusion restriction layer 22 exists. On the other hand, the first main fusion layer 13 is disposed to embed a part of the first electrode sheet 12 and not to expose the part of the first electrode sheet 12 to the outside in the region where the first fusion restriction layer 22 does not exist. Besides, the first conductive portion 21b of the first leading wire 21 is electrically connected to the part of the first electrode sheet 12 exposed to the outside due to the first fusion restriction layer 22.

Here, the first connection portion 20 has the first fusion restriction layer 22, and thereby the first electrode sheet 12 can be exposed outside over a sufficiently wide range. However, as described above, the first connection portion 20 may also not include the first fusion restriction layer 22. Even in this case, the first electrode sheet 12 can be exposed outside. Then, the first conductive portion 21b is electrically connected to the part of the first electrode sheet 12 exposed outside.

The first clamp 23 fixes the first conductive portion 21b of the first leading wire 21 to the first terminal portion 10b1 of the sheet body portion 10 in the region where the first electrode sheet 12 is exposed. In this example, the first conductive portion 21b is fixed to the first terminal portion 10b1 by three first clamps 23.

Furthermore, the first clamp 23 brings the first conductive portion 21b of the first leading wire 21 into direct contact with the first electrode sheet 12 to thereby electrically connect the first conductive portion 21b and the first electrode sheet 12.

Furthermore, the first clamp 23 is formed of an electrically conductive material such as metal and the like. Besides, the first clamp 23 is in direct contact with the first conductive portion 21b and in direct contact with the first electrode sheet 12. Accordingly, the first conductive portion 21b and the first electrode sheet 12 are also electrically connected via the first clamp 23.

The first connection protective layer 24 is formed in a sheet shape by, for example, a thermoplastic material that can function as a fusion material, particularly a thermoplastic elastomer. The first connection protective layer 24 can also use, in addition to the thermoplastic material, an insulating sheet made of resin which has an adhesive layer or a bonding layer. As shown in FIG. 2, the first connection protective layer 24 is formed in a shape corresponding to a region of the first leading wire 21 located on the first electrode sheet 12 and a region in which the first clamp 23 exists. As shown in FIGS. 4 and 5, the first connection protective layer 24 is disposed on the surface of the first electrode sheet 12 (the first outer surface 12c of the first electrode sheet 12) opposite to the dielectric layer 11, and protects the first conductive portion 21b of the first leading wire 21 and the first clamp 23. Particularly, the first connection protective layer 24 covers a part of the first electrode sheet 12 that is not protected by the first main protective layer 14.

Then, the first connection protective layer 24 is joined, for example, by the first connection fusion layer 25 formed of a fusion material. Besides, when the first connection protective layer 24 is an insulating sheet made of resin which has an adhesive layer or a bonding layer, the first connection fusion layer 25 does not exist. Specifically, as shown in FIGS. 4 and 5, the first connection protective layer 24 is joined to the first lead 21, the exposed part of the first outer surface 12c of the first electrode sheet 12, and the first clamp 23 by the first connection fusion layer 25.

In other words, the first connection fusion layer 25 joins a boundary site between the first connection protective layer 24 and the first leading wire 21. Furthermore, the first connection fusion layer 25 joins a boundary site between the first connection protective layer 24 and the first electrode sheet 12. Specifically, the first connection fusion layer 25 joins a boundary site including the first outer surface 12c and the inner peripheral surface of the first through holes 12a of the first electrode sheet 12.

Here, in this example, a part of the first connection protective layer 24 functions as the first connection fusion layer 25 joined to the first leading wire 21 and the like. In other words, the first connection fusion layer 25 is disposed as a part of the first connection protective layer 24, and joins the first leading wire 21 and the like to the first connection protective layer 24. Besides, the first connection fusion layer 25 can also be joined as a separate member to the first connection protective layer 24 and join the first leading wire 21 and the like to the first connection protective layer 24.

Furthermore, a part of the first connection protective layer 24 is also joined to the first main protective layer 14 by the first connection fusion layer 25. Accordingly, the first connection protective layer 24 is integrated with the sheet body portion 10. Furthermore, a part of the first connection protective layer 24 is also joined to the first fusion restriction layer 22 by the first connection fusion layer 25 via the first through holes 12a of the first electrode sheet 12.

As described above, the first connection fusion layer 25 is formed by applying heat to the raw material of the first connection protective layer 24 formed of a thermoplastic elastomer. Therefore, the first connection fusion layer 25 is configured by the same material components as the first connection protective layer 24. In other words, the first connection fusion layer 25 is formed without substantial change in the material components of the first connection protective layer 24. It means that the first connection fusion layer 25 does not contain a component such as a volatile adhesive, an organic solvent or the like.

The first rear surface protective layer 26 is formed in the same material and the same shape as the first connection protective layer 24. The first rear surface protective layer 26 can also use an insulating sheet made of resin which has an adhesive layer or a bonding layer in addition to the thermoplastic material. The first rear surface protective layer 26 is disposed on the surface opposite to the first connection protective layer 24 in the first terminal portion 10b1 of the sheet body portion 10. Here, the distal end side (a part of a first bent-back portion 23c described later) of the first clamp 23 is exposed from the second surface of the first terminal portion 10*b*1 of the sheet body portion 10, and thus the first rear surface protective layer 26 covers the part.

Then, the first rear surface protective layer 26 is joined, for example, by the first rear surface fusion layer 27 formed of a fusion material to the second surface of the first terminal portion 10*b*1. Besides, when the first rear surface protective layer 26 is an insulating sheet made of resin which has an adhesive layer or a bonding layer, the first rear surface fusion layer 27 does not exist.

In this example, a part of the first rear surface protective layer 26 functions as the first rear surface fusion layer 27. In other words, the first rear surface fusion layer 27 is disposed as a part of the first rear surface protective layer 26, and joins the second surface of the first terminal portion 10*b*1 and the first rear surface protective layer 26. Besides, the first rear surface fusion layer 27 can also be joined as a separate member to the first rear surface protective layer 26 and join the second surface of the first terminal portion 10*b*1 and the first rear surface protective layer 26.

As described above, the first rear surface fusion layer 27 is formed by applying heat to the raw material of the first rear surface protective layer 26 formed of a thermoplastic elastomer. Therefore, the first rear surface fusion layer 27 is configured by the same material components as the first rear surface protective layer 26. In other words, the first rear surface fusion layer 27 is formed without substantial change in the material components of the first rear surface protective layer 26. It means that the first rear surface fusion layer 27 does not contain a component such as a volatile adhesive, an organic solvent, or the like.

4. Detailed Configuration of Second Connection Portion 30

The configuration of the second connection portion 30 is described. The second connection portion 30 has substantially the same configuration as the first connection portion 20. That is, the second connection portion 30 corresponds to a configuration in which the first connection portion 20 shown in FIGS. 3 and 4 is inverted upside down.

As shown in FIGS. 1 and 2, the second leading wire 31 includes a second leading wire body 31*a* that covers a conductive wire with an insulating material, and a second conductive portion 31*b* that is disposed on the distal end side and exposes the conductive wire. The second leading wire body 31*a* of the second leading wire 31 is disposed on the side of a surface (second outer surface 15*c*) of the second electrode sheet 15 opposite to the dielectric layer 11. The second conductive portion 31*b* of the second leading wire 31 is disposed on the second surface side of the dielectric layer 11. The second conductive portion 31*b* may be disposed on the second outer surface 15*c* side of the second electrode sheet 15, or may be entangled with the second electrode sheet 15. Besides, the second conductive portion 31*b* is electrically connected to the second electrode sheet 15.

The second fusion restriction layer 32, the second clamp 33, the second connection protective layer 34, the second connection fusion layer 35, the second rear surface protective layer 36, and the second rear surface fusion layer 37 have substantially the same configuration as the first fusion restriction layer 22, the first clamp 23, the first connection protective layer 24, the first connection fusion layer 25, the first rear surface protective layer 26, and the first rear surface fusion layer 27, respectively. Therefore, detailed descriptions thereof are omitted.

5. Detailed Configuration of First Clamp 23

The configuration of the first clamp 23 is described with reference to FIGS. 4 and 5. The first clamp 23 is formed of an electrically conductive metal material such as iron, aluminium or the like, and has a rigidity sufficient to maintain the shape of the first clamp 23 even if the sheet body portion 10 deforms.

The first clamp 23 includes a plurality of first leg portions 23*a*, a first coupling portion 23*b*, and a plurality of first bent-back portions 23*c*. Here, in this example, a case in which the first clamp 23 includes two first leg portions 23*a* is given as an example, but the first clamp 23 can also include three or more first leg portions 23*a*.

The two first leg portions 23*a* are formed in a straight line shape and penetrate the first terminal portion 10*b*1 of the sheet body portion 10 in the thickness direction of the first terminal portion 10*b*1. The two first leg portions 23*a* are located on two sides with the first conductive portion 21*b* of the first leading wire 21 sandwiched therebetween. Here, the proximal end of the first leg portion 23*a* is set as the first surface side of the sheet body portion 10, and the distal end of the first leg portion 23*a* is set as the second surface side of the sheet body portion 10.

The middle of the first leg portion 23*a* is brought into contact with the inner peripheral surface of the first through hole 12*a* of the first electrode sheet 12. Therefore, the transverse cross-sectional shape of the first leg portion 23*a* is formed larger than that of the first through hole 12*a*. In other words, the first leg portion 23*a* is in contact with the first electrode sheet 12 regardless of the part of the first terminal portion 10*b*1 penetrated by the first leg portion 23*a*. Besides, the first clamp 23 is formed of an electrically conductive metal material. Accordingly, the first leg portions 23*a* are electrically connected to the first electrode sheet 12 by coming into contact with the first electrode sheet 12.

The first coupling portion 23*b* couples the proximal ends of the plurality of first leg portions 23*a*. In this example, the first coupling portion 23*b* is formed in a straight line shape. However, the first coupling portion 23*b* can have an arbitrary shape, for example, a wavy shape. The first coupling portion 23*b* is disposed across the first conductive portion 21*b* of the first leading wire 21. Accordingly, the first coupling portion 23*b* intersects the first conductive portion 21*b*. Between the first coupling portion 23*b* and the exposed surface of the first electrode sheet 12, the first conductive portion 21*b* is interposed in contact with both. In other words, the first conductive portion 21*b* is in contact with the exposed surface of the first electrode sheet 12 and in contact with the first coupling portion 23*b*.

The plurality of first bent-back portions 23*c* is formed by bending from the respective distal ends of the plurality of first leg portions 23*a*. The first bent-back portions 23*c* are locked with the second surface of the first terminal portion 10*b*1 of the sheet body portion 10. In other words, the first bent-back portions 23*c* are locked with the first terminal portion 10*b*1 and thereby the first clamp 23 is fixed to the first terminal portion 10*b*1.

Here, the first clamp 23 is operated as follows when being fixed to the first terminal portion 10*b*1. The distal end of the U-shaped raw material of the first clamp 23 is inserted from the first surface side of the first terminal portion 10*b*1, and the first coupling portion 23*b* is pressed against the first conductive portion 21*b*. After that, the first bent-back portion 23*c* is formed by bending the distal end of the U-shaped raw material of the first clamp 23. In other words, the first conductive portion 21*b* comes into contact with the exposed surface of the first electrode sheet 12 in a state of being pressed by the first coupling portion 23*b*.

Particularly, the dielectric layer 11 of the sheet body portion 10 is formed of an elastic body. Accordingly, the first clamp 23 is fixed to the first terminal portion 10b1 in a state that the dielectric layer 11 of the first terminal portion 10b1 is compressed. Therefore, the first conductive portion 21b is always in contact with the exposed surface of the first electrode sheet 12 and the first coupling portion 23b in a state of being pressed by a reaction force of the dielectric layer 11.

Furthermore, the first conductive portion 21b is formed of a stranded wire. Then, the first conductive portion 21b is pressed against the first coupling portion 23b and the exposed surface of the first electrode sheet 12, and thereby the stranded wire originally arranged in a cylindrical shape extends planarly. Accordingly, the first conductive portion 21b extending planarly comes into contact with the first electrode sheet 12 and comes into contact with the first coupling portion 23b in a wide range. Thereby, the contact between the first conductive portion 21b and the first electrode sheet 12 can be ensured, and the contact between the first conductive portion 21b and the first coupling portion 23b can be ensured.

The first electrode sheet 12 and the first conductive portion 21b are electrically connected by the direct contact as described above. Furthermore, since the first leg portions 23a are in direct contact with the first through holes 12a of the first electrode sheet 12, the first electrode sheet 12 and the first conductive portion 21b are electrically connected via the first leg portions 23a and the first coupling portion 23b.

6. Detailed Configuration of Second Clamp 33

The configuration of the second clamp 33 is described. The second clamp 33 has substantially the same configuration as the first clamp 23. That is, the second clamp 33 corresponds to a configuration in which the first clamp 23 shown in FIGS. 3 and 4 is inverted upside down.

The second clamp 33 includes a plurality of second leg portions 33a, a second coupling portion 33b, and a plurality of second bent-back portions 33c. The second leg portion 33a, the second coupling portion 33b, and the second bent-back portion 33c have substantially the same configuration as the first leg portion 23a, the first coupling portion 23b, and the first bent-back portion 23c, respectively. Therefore, detailed descriptions thereof are omitted.

7. Detailed Configuration of Terminal Portion 10b of First Example

Figure 6:
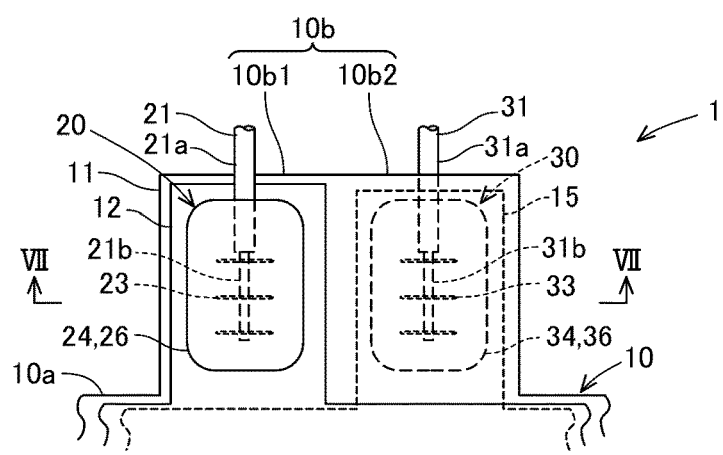
FIG. 6 is a schematic plan view of a terminal portion of the first example in the transducer 1 of the first example.
Figure 7:
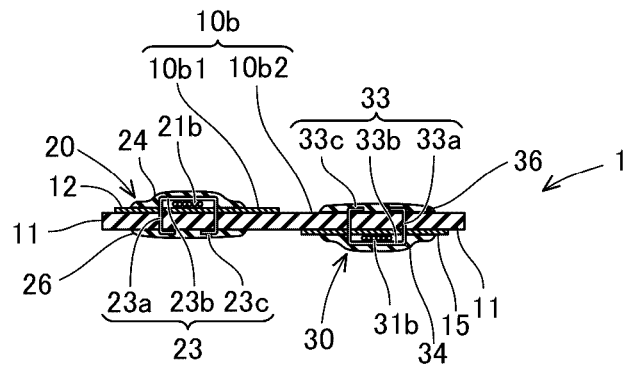
FIG. 7 is a cross-sectional view taken along a line VII-VII in FIG. 6.

The detailed configuration of the terminal portion 10b of a first example in the transducer 1 of the first example is described with reference to FIGS. 6 and 7. Here, in FIGS. 6 and 7, for the sake of schematic illustration, the sheet body portion 10 is configured by the dielectric layer 11, the first electrode sheet 12, and the second electrode sheet 15. In addition, in the first connection portion 20 and the second connection portion 30, the first fusion restriction layer 22, the first connection fusion layer 25, the first rear surface fusion layer 27, the second fusion restriction layer 32, the second connection fusion layer 35, and the second rear surface fusion layer 37 are not shown either.

As described above, the terminal portion 10b includes the first terminal portion 10b1 and the second terminal portion 10b2. Here, the first electrode sheet 12 is disposed in the first terminal portion 10b1 and is not disposed in the second terminal portion 10b2. On the other hand, the second electrode sheet 15 is disposed in the second terminal portion 10b2 and is not disposed in the first terminal portion 10b1.

In the first terminal portion 10b1, the first conductive portion 21b of the first leading wire 21 is in contact with the first electrode sheet 12. The first conductive portion 21b is fixed to the first terminal portion 10b1 by the first clamp 23. The first connection protective layer 24 covers the first conductive portion 21b and the first coupling portion 23b of the first clamp 23. Furthermore, the first rear surface protective layer 26 covers the first bent-back portion 23c of the first clamp 23.

In addition, in the second terminal portion 10b2, the second conductive portion 31b of the second leading wire 31 is in contact with the second electrode sheet 15. The second conductive portion 31b is fixed to the second terminal portion 10b2 by the second clamp 33. The second connection protective layer 34 covers the second conductive portion 31b and the second coupling portion 33b of the second clamp 33. Furthermore, the second rear surface protective layer 36 covers the second bent-back portion 33c of the second clamp 33.

Then, the first connection portion 20 and the second connection portion 30 are arranged offset in the plane direction of the sheet body portion 10. Here, the second electrode sheet 15 is not disposed in the first terminal portion 10b1. In other words, the second electrode sheet 15 is not disposed in the region where the first clamp 23 exists. Accordingly, the first clamp 23 does not come into contact with the second electrode sheet 15 even if the first leg portions 23a of the first clamp 23 penetrate the first terminal portion 10b1. In other words, the first clamp 23 is not electrically connected to the second electrode sheet 15.

Similarly, the first electrode sheet 12 is not disposed in the second terminal portion 10b2. In other words, the first electrode sheet 12 is not disposed in the region where the second clamp 33 exists. Accordingly, the second clamp 33 does not come into contact with the first electrode sheet 12 even if the second leg portions 33a of the second clamp 33 penetrate the second terminal portion 10b2. In other words, the second clamp 33 is not electrically connected to the first electrode sheet 12.

Furthermore, the first clamp 23 fixes the first conductive portion 21b of the first leading wire 21 to the first terminal portion 10b1 of the sheet body portion 10. In other words, the first conductive portion 21b is fixed to the first terminal portion 10b1 of the sheet body portion 10 without application of solder or welding. Compared with soldering or welding, the first coupling portion 23b of the first clamp 23 can be made thinner. Accordingly, the thickness can be reduced at the site where the first conductive portion 21b of the first leading wire 21 is connected to the first electrode sheet 12. Similarly, by using the second clamp 33, the thickness can be reduced at the site where the second conductive portion 31b of the second leading wire 31 is connected to the second electrode sheet 15.

8. Detailed Configuration of Terminal Portion 10b of Second Example

Figure 8:
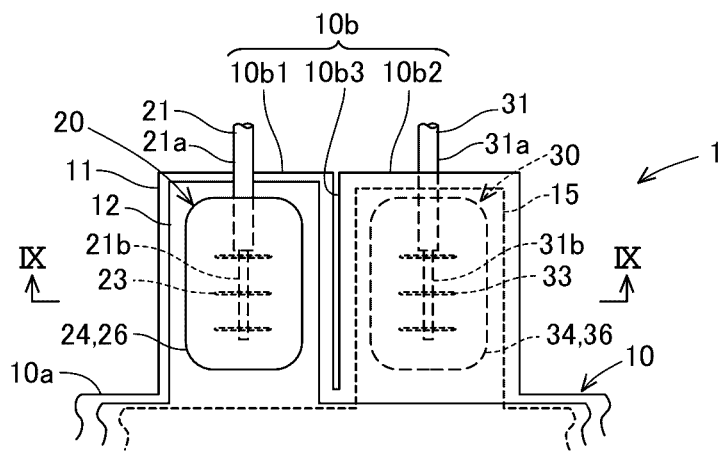
FIG. 8 is a schematic plan view of the terminal portion of a second example in the transducer 1 of the first example.
Figure 9:
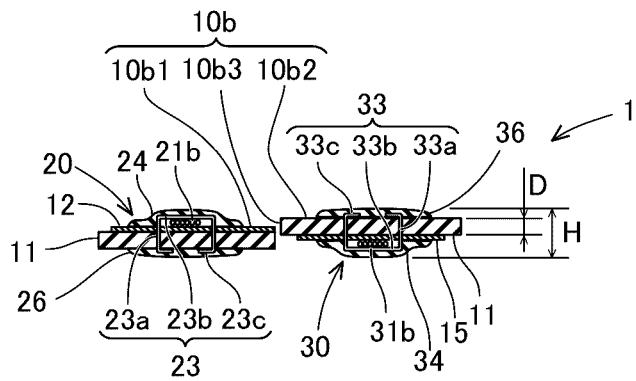
FIG. 9 is a cross-sectional view taken along a line IX-IX in FIG. 8.

The detailed configuration of the terminal portion 10b of a second example in the transducer 1 of the first example is described with reference to FIGS. 8 and 9. The terminal portion 10b of the second example includes a deformation allowable portion 10b3 in addition to the first terminal portion 10b1 and the second terminal portion 10b2.

The deformation allowable portion 10b3 is located in a boundary portion between the first terminal portion 10b1 and the second terminal portion 10b2. The deformation allowable portion 10b3 is located in a boundary portion between the first connection portion 20 and the second connection portion 30 in the offset direction. The deformation allowable portion 10b3 allows the first terminal portion 10b1 and the second terminal portion 10b2 to relatively move toward the surface normal direction.

Specifically, in the surface normal direction (thickness direction) of the sheet body portion 10, the first terminal portion 10b1 and the second terminal portion 10b2 are disposed in a manner that a distance between the first electrode sheet 12 in the first terminal portion 10b1 and the second electrode sheet 15 in the second terminal portion 10b2 is shorter than a facing distance D (shown in FIG. 9) between the first electrode sheet 12 and the second electrode sheet 15 in the transducer portion 10a corresponding to a state before deformation performed by the deformation allowable portion 10b3.

Here, in this example, the deformation allowable portion 10b3 is a slit cut from the first surface over the second surface of the terminal portion 10b of the sheet body portion 10. Then, as shown in FIG. 9, abutting surfaces forming the slit are staggered in the thickness direction of the sheet body portion 10. In other words, compared with the facing distance D between the first electrode sheet 12 and the second electrode sheet 15 in the transducer portion 10a corresponding to the state before deformation performed by the deformation allowable portion 10b3, the distance in the thickness direction between the first electrode sheet 12 in the first terminal portion 10b1 and the second electrode sheet 15 in the second terminal portion 10b2 is shortened. As a result, the distance between the first conductive portion 21b and the second conductive portion 31b in the thickness direction of the sheet body portion 10 is shortened.

As described above, the first conductive portion 21b and the second conductive portion 31b are offset in the plane direction, and the terminal portion 10b includes the deformation allowable portion 10b3. The deformation allowable portion 10b3 acts to bring the first conductive portion 21b and the second conductive portion 31b close to each other in the thickness direction of the sheet body portion 10. In other words, the site of the dielectric layer 11 facing the first conductive portion 21b and the site of the dielectric layer 11 facing the second conductive portion 31b are not located on the same plane and deviate in the thickness direction of the dielectric layer 11.

Accordingly, the range in the thickness direction of a site including the first conductive portion 21b, the first electrode sheet 12, and the dielectric layer 11 overlaps the range in the thickness direction of a site including the second conductive portion 31b, the second electrode sheet 15, and the dielectric layer 11 in most part. In other words, even when the first leading wire 21 and the second leading wire 31 are disposed on the opposite sides of the sheet body portion 10, a thickness H of the entire terminal portion 10b is reduced. As a result, the maximum thickness of the entire electrostatic sheet constituting the transducer 1 can be reduced.

Furthermore, the first electrode sheet 12 is disposed in the first terminal portion 10b1 and is not disposed in the second terminal portion 10b2. On the other hand, the second electrode sheet 15 is not disposed in the first terminal portion 10b1 and is disposed in the second terminal portion 10b2. Accordingly, the first electrode sheet 12 is disposed in the first terminal portion 10b1 only and the second electrode sheet 15 is disposed in the second terminal portion 10b2 only, and thereby the thickness H of the entire terminal portion 10b is further reduced.

9. Detailed Configuration of Terminal Portion 10b of Third Example

Figure 10:
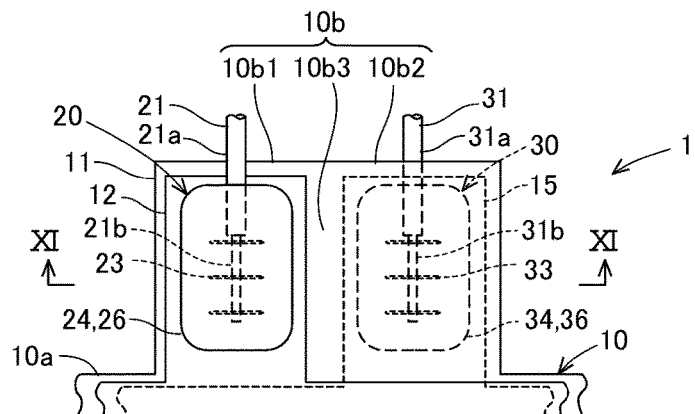
FIG. 10 is a schematic plan view of the terminal portion of a third example in the transducer 1 of the first example.
Figure 11:
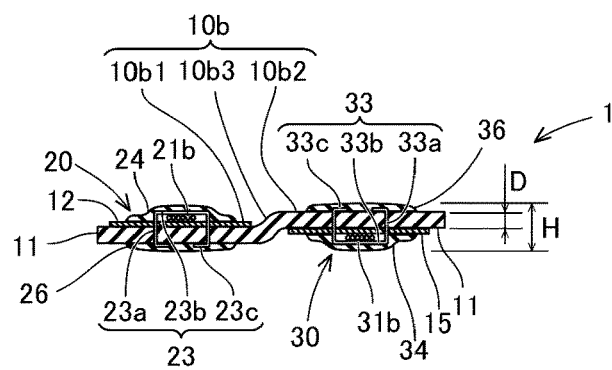
FIG. 11 is a cross-sectional view taken along a line XI-XI in FIG. 10.

The detailed configuration of the terminal portion 10b of a third example in the transducer 1 of the first example is described with reference to FIGS. 10 and 11. The terminal portion 10b of the third example is different from the terminal portion 10b of the second example in terms of the deformation allowable portion 10b3.

In this example, the deformation allowable portion 10b3 is configured by bending deformation of the dielectric layer 11 formed of an elastomer. The dielectric layer 11 of the first terminal portion 10b1 and the dielectric layer 11 of the second terminal portion 10b2 are continuously connected by the dielectric layer 11 of the deformation allowable portion 10b3. The deformation allowable portion 10b3 is deformed and formed in step by the bending deformation of the dielectric layer 11.

In this way, in the surface normal direction (thickness direction) of the sheet body portion 10, the first terminal portion 10b1 and the second terminal portion 10b2 are disposed in a manner that the distance between the first electrode sheet 12 in the first terminal portion 10b1 and the second electrode sheet 15 in the second terminal portion 10b2 is shorter than the facing distance D (shown in FIG. 11) between the first electrode sheet 12 and the second electrode sheet 15 in the transducer portion 10a corresponding to the state before deformation performed by the deformation allowable portion 10b3. As a result, the distance between the first conductive portion 21b and the second conductive portion 31b in the thickness direction of the sheet body portion 10 is shortened.

Accordingly, even when the first leading wire 21 and the second leading wire 31 are disposed on the opposite sides of the dielectric layer 11, the thickness H of the entire terminal portion 10b is reduced. As a result, the maximum thickness of the entire electrostatic sheet constituting the transducer 1 can be reduced.

In addition, when a long distance between the first terminal portion 10b1 and the second terminal portion 10b2 can be secured in the plane direction of the sheet body portion 10, the deformation allowable portion 10b3 of this example is suitable. In this case, a large deviation between the dielectric layer 11 of the first terminal portion 10b1 and the dielectric layer 11 of the second terminal portion 10b2 can be ensured, and the shape of the dielectric layer 11 is a simple shape.

10. Manufacturing Method of Transducer 1 of First Example

A manufacturing method of the electrostatic sheet constituting the transducer 1 of the first example is described with reference to FIG. 4 and FIGS. 12-15. FIGS. 12-15 illustrate a manufacturing method of a part of the first terminal portion 10b1. Here, a manufacturing method of a part of the second terminal portion 10b2 substantially has a structure in which the first terminal portion 10b1 is inverted.

First, the raw material 11a of the dielectric layer 11, the first electrode sheet 12, and the second electrode sheet 15 constituting the sheet body portion 10 are prepared. Here, in the first terminal portion 10b1, the raw material 11a of the dielectric layer 11 constitutes the dielectric layer 11, the raw material of the first main fusion layer 13, and the raw material of the first main protective layer 14 from the lower surface side of FIG. 12. Besides, in the second terminal portion 10b2, the raw material 11a of the dielectric layer 11 constitutes the dielectric layer 11, the raw material of the second main fusion layer 16, and the raw material of the second main protective layer 17. In addition, in the transducer portion 10a, the raw material 11a of the dielectric layer 11 constitutes the raw material of the second main protective layer 17, the raw material of the second main fusion layer 16, the dielectric layer 11, the raw material of the first main fusion layer 13, and the raw material of the first main protective layer 14.

In addition, the first leading wire 21, the first fusion restriction layer 22, the first clamp 23, the raw material of the first connection protective layer 24, and the raw material of the first rear surface protective layer 26 constituting the first connection portion 20 are prepared. Here, the raw material of the first connection protective layer 24 constitutes the raw material of the first connection fusion layer 25 and the first connection protective layer 24. The raw material of the first rear surface protective layer 26 constitutes the raw material of the first rear surface fusion layer 27 and the first rear surface protective layer 26. Besides, in the configuration in which the first connection portion 20 does not include the first fusion restriction layer 22, the first connection fusion layer 25, or the first rear surface fusion layer 27, preparation of these parts is unnecessary.

In addition, the second leading wire 31, the second fusion restriction layer 32, the second clamp 33, the raw material of the second connection protective layer 34, and the raw material of the second rear surface protective layer 36 constituting the second connection portion 30 are prepared. Here, the raw material of the second connection protective layer 34 constitutes the raw material of the second connection fusion layer 35 and the second connection protective layer 34. The raw material of the second rear surface protective layer 36 constitutes the raw material of the second rear surface fusion layer 37 and the second rear surface protective layer 36. Besides, in the configuration in which the second connection portion 30 does not include the second fusion restriction layer 32, the second connection fusion layer 35, or the second rear surface fusion layer 37, preparation of these parts is unnecessary.

Figure 12:
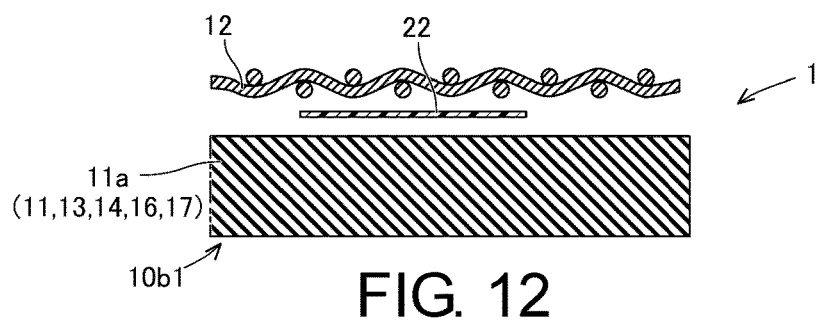
FIG. 12 is a diagram showing a state of a laminate formation process in a manufacturing method of the electrostatic sheet in the transducer 1 of the first example.

Next, as shown in FIG. 12, in the first terminal portion 10b1, a laminate is formed by lamination in an order of (a) the raw material 11a of the dielectric layer 11, (b) the first fusion restriction layer 22, (c) the first electrode sheet 12 (laminate formation process: S1). In other words, in FIG. 12, the dielectric layer 11, the raw material of the first main fusion layer 13, the raw material of the first main protective layer 14, the first fusion restriction layer 22, the first electrode sheet 12 are laminated in order.

In addition, although not shown, in the second terminal portion 10b2, a laminate is formed by lamination in an order of (a) the second electrode sheet 15, (b) the second fusion restriction layer 32, and (c) the raw material 11a of the dielectric layer 11. In addition, although not shown, in the transducer portion 10a, a laminate is formed by lamination in an order of (a) the second electrode sheet 15, (b) the raw material 11a of the dielectric layer 11, and (c) the first electrode sheet 12.

Figure 13:
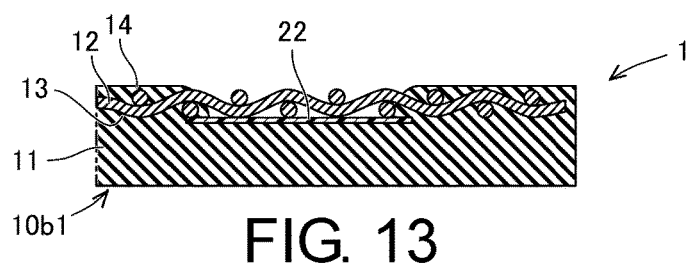
FIG. 13 is a diagram showing a state of a pressurizing and heating process in the manufacturing method of the electrostatic sheet in the transducer 1 of the first example.

Subsequently, the entire laminate is heated while being pressurized in the thickness direction (pressurizing and heating process: S2). Thereby, the first surface side of the raw material 11a of the dielectric layer 11 formed of a thermoplastic elastomer is melted. Then, as shown in FIG. 13, the first electrode sheet 12 is embedded on the first surface side of the raw material 11a of the dielectric layer 11 in a region excluding a region facing the first fusion restriction layer 22.

In this way, a part of the raw material 11a of the dielectric layer 11 forms the first main fusion layer 13 and joins the dielectric layer 11 and the first electrode sheet 12. In other words, the first main fusion layer 13 joins the dielectric layer 11 and the first electrode sheet 12 in the region excluding the region facing the first fusion restriction layer 22. Furthermore, in the region excluding the region facing the first fusion restriction layer 22, a part of the raw material 11a of the dielectric layer 11 covers the first outer surface 12c side of the first electrode sheet 12, and thereby the first main protective layer 14 is formed.

Furthermore, in the region facing the first fusion restriction layer 22, the raw material 11a of the dielectric layer 11 forms the first main fusion layer 13 and joins the dielectric layer 11 and the inner surface of the first fusion restriction layer 22. Here, the first fusion restriction layer 22 restricts the first main fusion layer 13 from being fused to the first electrode sheet 12. Therefore, due to the first fusion restriction layer 22, the first main fusion layer 13 is not joined to a part of the first electrode sheet 12, and the part of the first electrode sheet 12 is exposed outside of the first main fusion layer 13.

Then, the first main fusion layer 13 does not exist in at least the central portion on the outer surface side of the first fusion restriction layer 22. On the other hand, the first main fusion layer 13 is disposed around the outer edge on the outer surface side of the first fusion restriction layer 22. In other words, the outer edge of the first fusion restriction layer 22 is embedded by the first main fusion layer 13.

Furthermore, a part on the second surface side of the raw material 11a of the dielectric layer 11 is melted. Then, although not shown, the second electrode sheet 15 is embedded on the second surface side of the raw material 11a of the dielectric layer 11 in a region excluding a region facing the second fusion restriction layer 32. In other words, the second main fusion layer 16 joins the dielectric layer 11 and the second electrode sheet 15 in the region excluding the region facing the second fusion restriction layer 32. Furthermore, in the region excluding the region facing the second fusion restriction layer 32, a part of the raw material 11a of the dielectric layer 11 covers the second outer surface 15c side of the second electrode sheet 15, and thereby the second main protective layer 17 is formed. In addition, in the region facing the second fusion restriction layer 32, the situation is similar to that in the region facing the first fusion restriction layer 22.

Besides, in the configuration in which the first connection portion 20 does not have the first fusion restriction layer 22, in the pressurizing and heating process S2, the pressurizing pressure at this site can be reduced compared with other sites to thereby expose a part of the first electrode sheet 12 to the outside of the raw material 11a of the dielectric layer 11 (the outside of the first main fusion layer 13). In addition, the above state can also be implemented by adjustment of the heating temperature in addition to the adjustment of the pressurizing pressure. In addition, the same applies to the configuration in which the second connection portion 30 does not have the second fusion restriction layer 32. That is, a part of the second electrode sheet 15 can be exposed to the outside of the raw material 11a of the dielectric layer 11 (the outside of the second main fusion layer 16).

Figure 14:
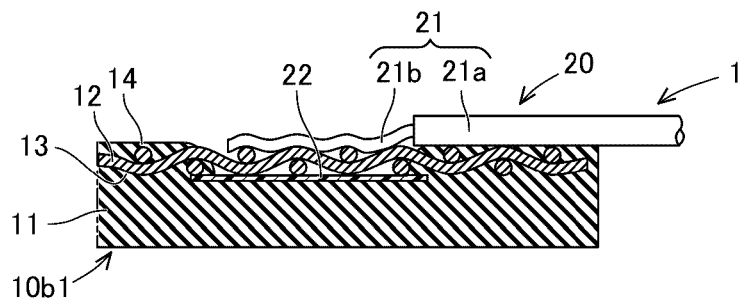
FIG. 14 is a diagram showing a state of a leading wire arrangement process in the manufacturing method of the electrostatic sheet in the transducer 1 of the first example.

Subsequently, as shown in FIG. 14, in the first terminal portion 10b1, the first leading wire 21 is disposed on the first outer surface 12c side of the first electrode sheet 12 (leading wire arrangement process: S3). Similar to the first leading wire 21, the second leading wire 31 is disposed on the second electrode sheet 15 side (leading wire arrangement process: S3).

Here, as shown in FIG. 14, the entire first conductive portion 21b of the first leading wire 21 is disposed in contact with the first outer surface 12c side of the first electrode sheet 12. In this way, the first conductive portion 21b of the first leading wire 21 is electrically connected to the first electrode sheet 12.

Figure 15:
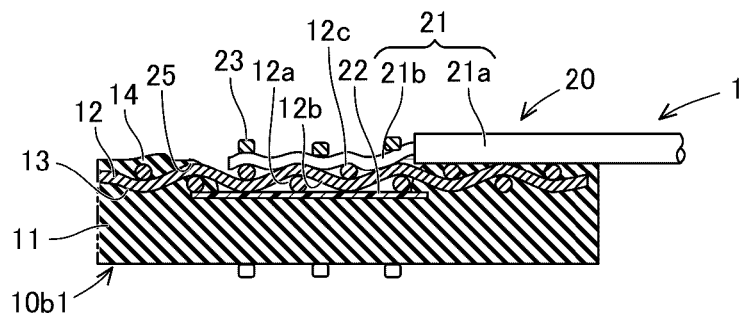
FIG. 15 is a diagram showing a state of a clamp fixation process in the manufacturing method of the electrostatic sheet in the transducer 1 of the first example.

Subsequently, as shown in FIG. 15, the first clamp 23 is attached in a connection region between the first conductive portion 21b of the first leading wire 21 and the first electrode sheet 12 (clamp fixation process: S4). In addition, the second clamp 33 is attached in a connection region between the second conductive portion 31b of the second leading wire 31 and the second electrode sheet 15 (S4).

Figure 4:
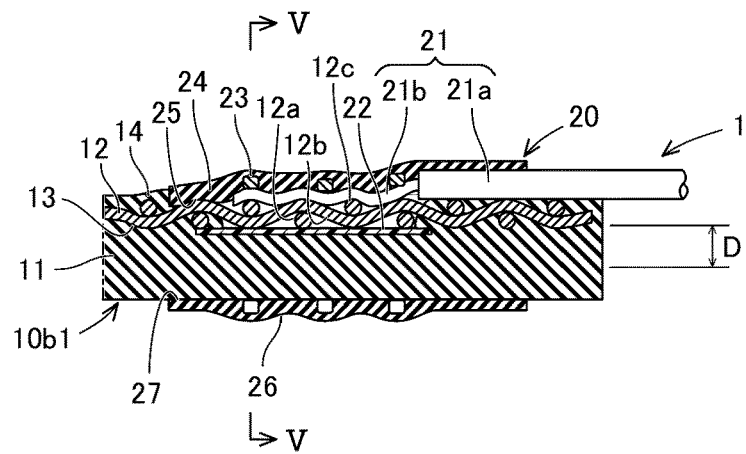
FIG. 4 is a cross-sectional view taken along a line IV-IV in FIG. 2.
Figure 5:
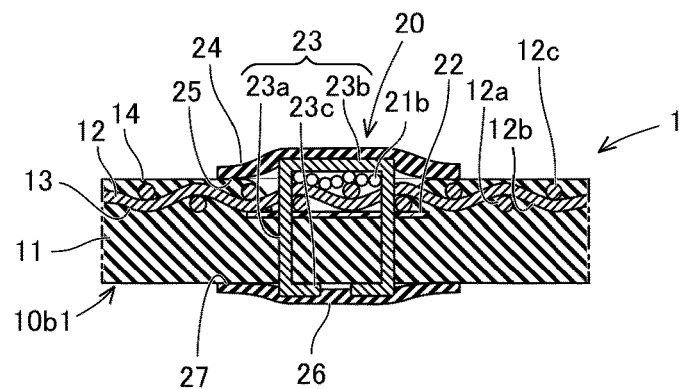
FIG. 5 is a cross-sectional view taken along a line V-V in FIG. 4.

Subsequently, as shown in FIG. 4, in the region facing the first fusion restriction layer 22, the raw material of the first connection protective layer 24 is disposed to cover the first electrode sheet 12, the first conductive portion 21b of the first leading wire 21, and the first clamp 23 (connection protective layer arrangement process: S5). In addition, in the region facing the second fusion restriction layer 32, the raw material of the second connection protective layer 34 is disposed to cover the second electrode sheet 15, the second conductive portion 31b of the second leading wire 31, and the second clamp 33 (S5).

Subsequently, as shown in FIG. 4, the raw material of the first rear surface protective layer 26 is disposed in a region where the first bent-back portion 23c of the first clamp 23 is exposed (rear surface protective layer arrangement process: S6). In addition, the raw material of the second rear surface protective layer 36 is disposed in a region where the second bent-back portion 33c of the second clamp 33 is exposed (S6).

Subsequently, the raw material of the first connection protective layer 24, the raw material of the second connection protective layer 34, the raw material of the first rear surface protective layer 26, and the raw material of the second rear surface protective layer 36 are heated while being pressurized in the thickness direction (protective layer fusion process: S7). Then, the first connection fusion layer 25 formed by the melting of the raw material of the first connection protective layer 24 joins the first electrode sheet 12, the first conductive portion 21b of the first leading wire 21, the first coupling portion 23b of the first clamp 23, and the first fusion restriction layer 22. Furthermore, a part of the first connection fusion layer 25 is also joined to the first main protective layer 14. In this way, the first connection protective layer 24 covers the region facing the first fusion restriction layer 22.

In addition, the second connection protective layer 34 is joined to the second electrode sheet 15, the second conductive portion 31b of the second leading wire 31, the second clamp 33, the second fusion restriction layer 32, and a part of the second main protective layer 17 by the second connection fusion layer 35 (S7). Furthermore, the first rear surface protective layer 26 is joined to the second surface of the dielectric layer 11 by the first rear surface fusion layer 27 (S7). Furthermore, the second rear surface protective layer 36 is joined to the first surface of the dielectric layer 11 by the second rear surface fusion layer 37 (S7).

Accordingly, due to the first fusion restriction layer 22, the first main fusion layer 13 is not joined to a part of the first electrode sheet 12 and the part of the first electrode sheet 12 is reliably disposed outside of the first main fusion layer 13. Accordingly, electrical connection of the first conductive portion 21b of the first leading wire 21 to the first electrode sheet 12 is easy and reliable. Furthermore, by disposing the part of the first electrode sheet 12 outside of the first main fusion layer 13, the first electrode sheet 12 and the first conductive portion 21b of the first leading wire 21 can be fixed in an electrically connected state by the first clamp 23 or the first connection protective layer 24. The same applies to the second fusion restriction layer 32.

Besides, when the first connection protective layer 24 is an insulating sheet made of resin which has an adhesive layer or a bonding layer, the first connection protective layer 24 can be pasted without heating in the protective layer fusion process S7 (protective layer pasting process: S7). In addition, the same applies to the case in which the second connection protective layer 34 is the above insulating sheet. That is, the second connection protective layer 34 can be pasted without heating.

11. Transducer 100 of Second Example

Figure 16:
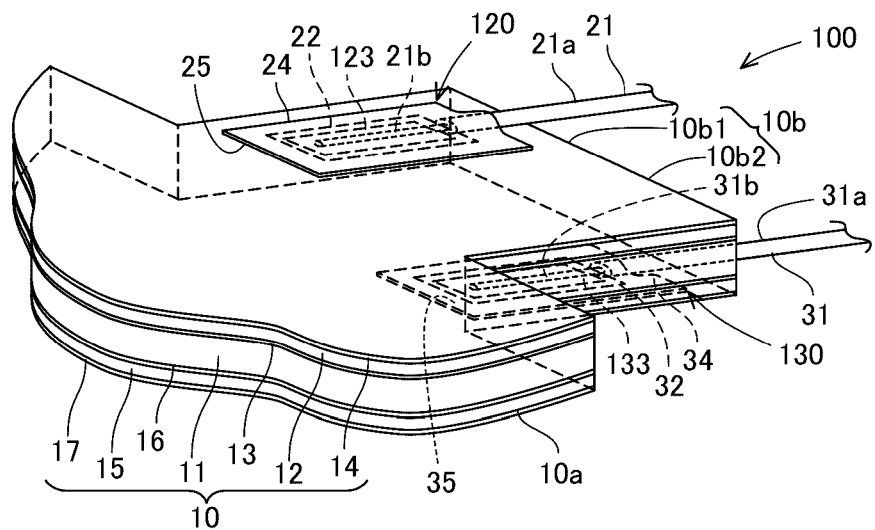
FIG. 16 is a perspective view showing an electrostatic sheet constituting a transducer 100 of a second example.
Figure 17:
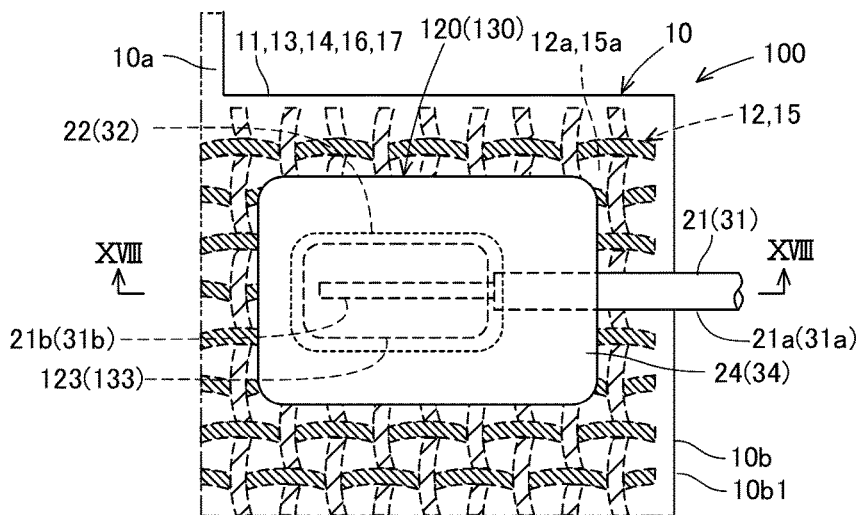
FIG. 17 is a plan view of the electrostatic sheet constituting the transducer 100 of the second example.

The electrostatic sheet constituting a transducer 100 of a second example is described with reference to FIGS. 16-18. The transducer 100 of the second example is substantially in common with the transducer 1 of the first example in terms of the sheet body portion 10, and is different from the transducer 1 of the first example in terms of a first connection portion 120 and a second connection portion 130. The first connection portion 120 and the second connection portion 130 are described below. However, within the configurations of the first connection portion 120 and the second connection portion 130, the same reference numerals are added to the same configurations as the first connection portion 20 and the second connection portion 30 in the transducer 1 of the first example, and the description is omitted.

Besides, in the first terminal portion 10b1 and the second terminal portion 10b2 of the sheet body portion 10, the first electrode sheet 12 and the second electrode sheet 15 are formed in the same shape. However, similar to the transducer 1 of the first example, in the first terminal portion 10b1 and the second terminal portion 10b2, the shapes of the first electrode sheet 12 and the second electrode sheet 15 may be different.

The first connection portion 120 includes at least the first leading wire 21, a first sticking layer 123, and the first connection protective layer 24. In this example, the first connection portion 120 includes the first leading wire 21, the first fusion restriction layer 22, the first sticking layer 123, the first connection protective layer 24, and the first connection fusion layer 25. That is, the first connection portion 120 is in common with the first connection portion 20 in the transducer 1 of the first example in terms of the first leading wire 21 and the first fusion restriction layer 22, and is different from the first connection portion 20 in terms of the first sticking layer 123, and in terms of not including the first rear surface protective layer 26 and the first rear surface fusion layer 27. The first sticking layer 123 is replaced by the first clamp 23. Besides, similar to the transducer 1 of the first example, the first connection portion 120 can also further have a configuration in which the first fusion restriction layer 22 and the first connection fusion layer 25 are not included.

The second connection portion 130 includes at least the second leading wire 31, a second sticking layer 133, and the second connection protective layer 34. In this example, the second connection portion 130 includes the second leading wire 31, the second fusion restriction layer 32, the second sticking layer 133, the second connection protective layer 34, and the second connection fusion layer 35. In addition, the second connection portion 130 is in common with the second connection portion 30 in the transducer 1 of the first example in terms of the second leading wire 31 and the second fusion restriction layer 32, and is different from the second connection portion 30 in terms of the second sticking layer 133 and in terms of not including the second rear surface protective layer 36 and the second rear surface fusion layer 37. The second sticking layer 133 is replaced by the second clamp 33. In addition, similar to the transducer 1 of the first example, the second connection portion 130 can also further have a configuration in which the second fusion restriction layer 32 and the second connection fusion layer 35 are not included.

In the first connection portion 120, the first sticking layer 123 sticks the first conductive portion 21b of the first leading wire 21 to the first electrode sheet 12 in a state that the first conductive portion 21b of the first leading wire 21 is electrically connected to the first electrode sheet 12 in a region where the first electrode sheet 12 is exposed. The first sticking layer 123 is, for example, an electrically conductive joining material such as a solder, an electrically conductive resin or the like. In other words, by the first sticking layer 123, the first conductive portion 21b of the first leading wire 21 is electrically connected to the first electrode sheet 12 widely and reliably.

Then, the first connection protective layer 24 is joined to the first leading wire 21, the exposed part of the first outer surface 12c of the first electrode sheet 12, and the first sticking layer 123 by the first connection fusion layer 25. Besides, when the first connection protective layer 24 is an insulating sheet made of resin which has an adhesive layer or a bonding layer, the first connection protective layer 24 is joined to the first leading wire 21, the first electrode sheet 12, and the first sticking layer 123 without having the first connection fusion layer 25.

In the second connection portion 130, the second sticking layer 133 sticks the second conductive portion 31b of the second leading wire 31 to the second electrode sheet 15 in a state that the second conductive portion 31b of the second leading wire 31 is electrically connected to the second electrode sheet 15 in a region facing the second fusion restriction layer 32. The second sticking layer 133 is, for example, an electrically conductive joining material such as a solder, an electrically conductive resin or the like. In other words, by the second sticking layer 133, the second conductive portion 31b of the second leading wire 31 is electrically connected to the second electrode sheet 15 widely and reliably.

Besides, the second connection protective layer 34 is joined to the second leading wire 31, the exposed part of the second outer surface 15c of the second electrode sheet 15, and the second sticking layer 133 by the second connection fusion layer 35. Furthermore, when the second connection protective layer 34 is an insulating sheet made of resin which has an adhesive layer or a bonding layer, the second connection protective layer 34 is joined to the second leading wire 31, the second electrode sheet 15, and the second sticking layer 133 without having the second connection fusion layer 35.

12. Manufacturing Method of Transducer 100 of Second Example

A manufacturing method of the electrostatic sheet constituting the transducer 100 of the second example is described with reference to FIGS. 12-14 and FIGS. 18-19. As shown in FIGS. 12-14, the laminate formation process S1, the pressurizing and heating process S2, and the leading wire arrangement process S3 in the manufacturing method of the transducer 1 of the first example are executed.

Figure 19:
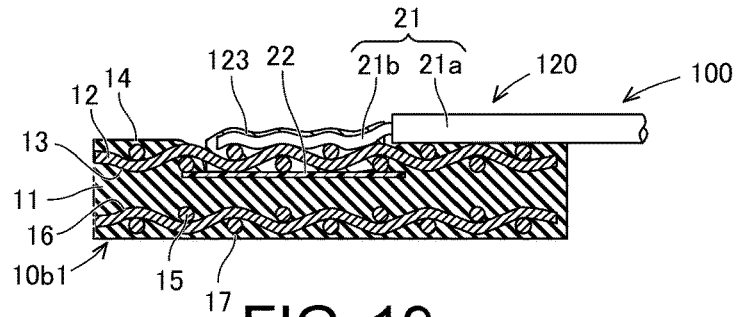
FIG. 19 is a diagram showing a state of a clamp fixation process in a manufacturing method of the electrostatic sheet in the transducer 100 of the second example.

Subsequently, as shown in FIG. 19, the first sticking layer 123 is formed of an electrically conductive joining material such as a solder, an electrically conductive resin or the like in the connection region between the first conductive portion 21b of the first leading wire 21 and the first electrode sheet 12 (sticking layer formation process: S14). In other words, the exposed first electrode sheet 12 and the first conductive portion 21b of the first leading wire 21 are stuck in a state of being electrically connected by the first sticking layer 123.

Particularly, in the configuration having the first fusion restriction layer 22, the first electrode sheet 12 is exposed due to existence of the first fusion restriction layer 22, and thus the first electrode sheet 12 and the first conductive portion 21b of the first leading wire 21 are electrically connected in an easy and reliable manner. Furthermore, similar to the formation of the first sticking layer 123, the second conductive portion 31b of the second leading wire 31 and the second electrode sheet 15 are electrically connected by the second sticking layer 133 (S14). Besides, as described above, the first connection portion 120 and the second connection portion may not include the first fusion restriction layer 22 and the second fusion restriction layer 32.

Figure 18:
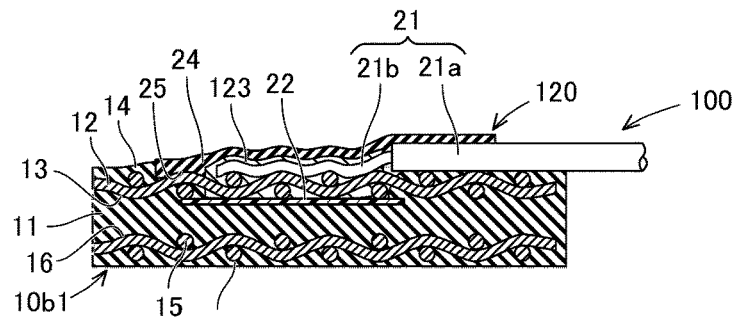
FIG. 18 is a cross-sectional view taken along a line XVIII-XVIII in FIG. 17.

Subsequently, as shown in FIG. 18, in the region where the first electrode sheet 12 is exposed, the first connection protective layer 24 is disposed to cover the first electrode sheet 12, the first conductive portion 21b of the first leading wire 21, and the first sticking layer 123 (connection protective layer arrangement process: S15). In addition, the same applies to the region where the second electrode sheet 15 is exposed.

Subsequently, the raw material of the first connection protective layer 24 and the raw material of the second connection protective layer 34 are heated while being pressurized in the thickness direction (protective layer fusion process: S16). Then, the first connection fusion layer 25 formed by the melting of the raw material of the first connection protective layer 24 joins the first electrode sheet 12, the first conductive portion 21b of the first leading wire 21, the first sticking layer 123, and the first fusion restriction layer 22. Furthermore, a part of the first connection fusion layer 25 is also joined to the first main protective layer 14. In this way, the first connection protective layer 24 covers the region facing the first fusion restriction layer 22. The same applies to the second connection protective layer 34. In this way, the transducer 100 of the second example is manufactured.

Besides, when the first connection protective layer 24 is an insulating sheet made of resin which has an adhesive layer or a bonding layer, the first connection protective layer 24 can be pasted without heating in the protective layer fusion process S16 (protective layer pasting process: S16). In addition, the same applies to the case in which the second connection protective layer 34 is the above insulating sheet. That is, the second connection protective layer 34 can be pasted without heating.

13. Transducer 200 of Third Example

Figure 20:
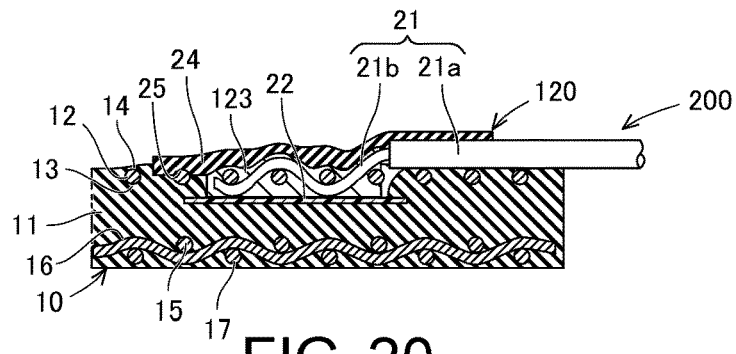
FIG. 20 is a cross-sectional view of an electrostatic sheet constituting a transducer 200 of a third example.

The electrostatic sheet constituting a transducer 200 of a third example is described with reference to FIG. 20. As shown in FIG. 20, the first conductive portion 21b may be entangled with the first electrode sheet 12. In this way, the first conductive portion 21b is electrically connected to the first electrode sheet 12. In addition, the second conductive portion 31b may also be entangled with the second electrode sheet 15. In this way, the second conductive portion 31b is electrically connected to the second electrode sheet 15. Besides, in the transducer 1 of the first example, the first conductive portion 21b may also be entangled with the first electrode sheet 12. The same applies to the second conductive portion 31b.

A manufacturing method of the transducer 200 of the third example is described. In the laminate formation process S1, the first conductive portion 21b of the first leading wire 21 is disposed to be entangled with the first electrode sheet 12. Subsequently, the pressurizing and heating process S2 is executed. Here, the leading wire arrangement process S3 in the second example is not executed.

Subsequently, the sticking layer formation process S14, the connection protective layer arrangement process S15, and the protective layer fusion process S16 (or protective layer pasting process S16) of the transducer 100 of the second example are executed. In this way, the transducer 200 of the third example is manufactured.

Besides, in this example, the first fusion restriction layer 22 and the second fusion restriction layer 32 are not included either, and a part of the first electrode sheet 12 and a part of the second electrode sheet 15 can be exposed. In addition, the first connection protective layer 24 and the second connection protective layer 34 can also be set as an insulating sheet made of resin.

14. Transducer 300 of Fourth Example

Figure 21:
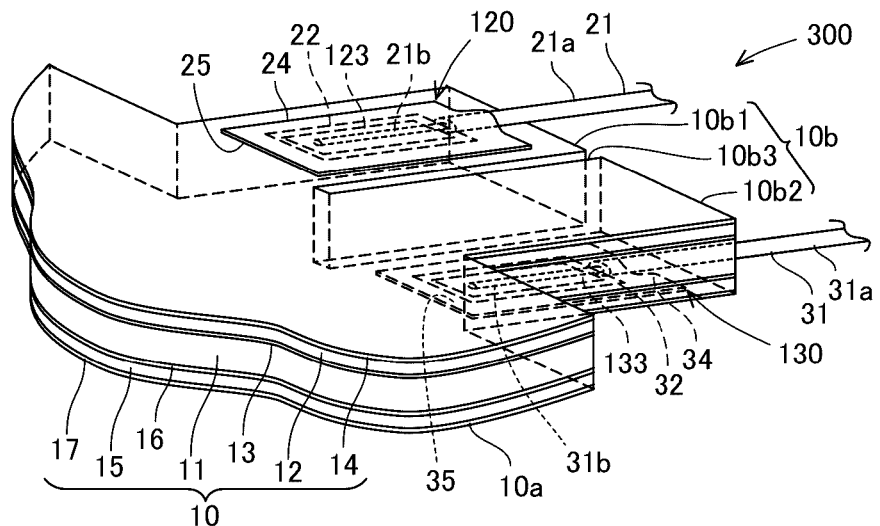
FIG. 21 is a perspective view of an electrostatic sheet constituting a transducer 300 of a fourth example.
Figure 22:
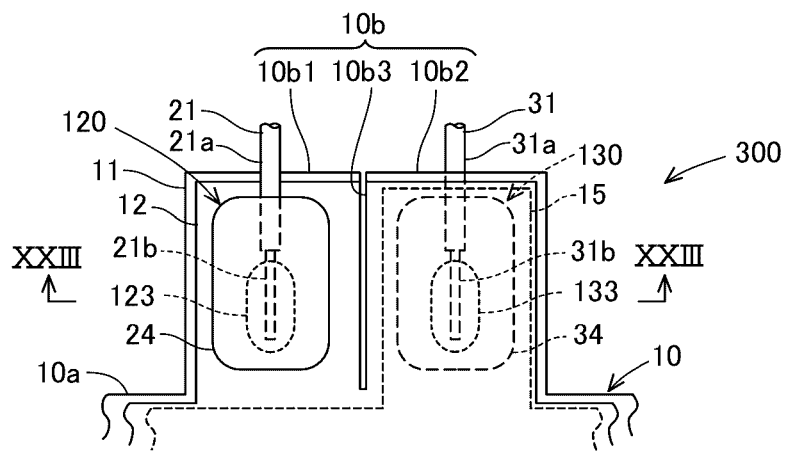
FIG. 22 is a schematic plan view of a terminal portion in the electrostatic sheet constituting the transducer 300 of the fourth example.
Figure 23:
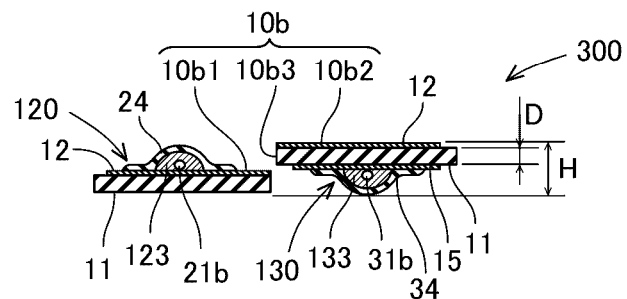
FIG. 23 is a cross-sectional view taken along a line XXIII-XXIII in FIG. 22.

The electrostatic sheet constituting a transducer 300 of a fourth example is described with reference to FIGS. 21-23. The transducer 300 of the fourth example is configured in the same manner as the transducer 100 of the second example except for the deformation allowable portion 10b3. In the transducer 300 of the fourth example, the terminal portion 10b includes the first terminal portion 10b1, the second terminal portion 10b2, and the deformation allowable portion 10b3. The deformation allowable portion 10b3 is the same as the terminal portion 10b of the second example in the transducer 1 of the first example.

That is, the deformation allowable portion 10b3 is located in a boundary portion between the first terminal portion 10b1 and the second terminal portion 10b2. The deformation allowable portion 10b3 is formed in the boundary portion between the first connection portion 120 and the second connection portion 130 in the offset direction. The deformation allowable portion 10b3 allows the first terminal portion 10b1 and the second terminal portion 10b2 to relatively move toward the surface normal direction. In this example, as shown in FIG. 21, the deformation allowable portion 10b3 is a slit cut from the first surface over the second surface of the terminal portion 10b of the sheet body portion 10.

The detailed configuration of the terminal portion 10b is described with reference to FIGS. 22 and 23. Here, in FIGS. 22 and 23, the sheet body portion 10 is configured by the dielectric layer 11, the first electrode sheet 12, and the second electrode sheet 15 for the sake of schematic illustration. In addition, in the first connection portion 120 and the second connection portion 130, the first fusion restriction layer 22, the first connection fusion layer 25, the second fusion restriction layer 32, and the second connection fusion layer 35 are not shown either.

Besides, the first connection portion 120 and the second connection portion 130 may not include the first fusion restriction layer 22 and the second fusion restriction layer 32. In addition, the first connection protective layer 24 and the second connection protective layer 34 can also use, in addition to the thermoplastic material, an insulating sheet made of resin which has an adhesive layer or a bonding layer.

As described above, the terminal portion 10b includes the first terminal portion 10b1, the second terminal portion 10b2, and the deformation allowable portion 10b3. Here, the first electrode sheet 12 is disposed in the first terminal portion 10b1 and is also disposed in the second terminal portion 10b2. However, the first electrode sheet 12 may also be disposed in the first terminal portion 10b1 only. On the other hand, the second electrode sheet 15 is disposed in the second terminal portion 10b2 only. However, the second electrode sheet 15 may also be disposed in the first terminal portion 10b1 and disposed in the second terminal portion 10b2.

The first conductive portion 21b of the first leading wire 21 is connected to the first terminal portion 10b1, and the first connection protective layer 24 covers the first conductive portion 21b. The second conductive portion 31b of the second leading wire 31 is connected to the second terminal portion 10b2, and the second connection protective layer 34 covers the second conductive portion 31b. In other words, the first conductive portion 21b and the second conductive portion 31b are disposed offset in the plane direction of the dielectric layer 11 (left-right direction in FIGS. 22 and 23).

Here, the first conductive portion 21b is disposed on the first surface side of the dielectric layer 11, and the second conductive portion 31b is disposed on the second surface side of the dielectric layer 11. In other words, the first conductive portion 21b and the second conductive portion 31b are disposed on the opposite surfaces of the dielectric layer 11.

Furthermore, in the first connection portion 120, the first sticking layer 123 is particularly thick. Therefore, the first connection portion 120 including the first conductive portion 21b protrudes from the first surface of the dielectric layer 11 to the surface normal direction. In addition, in the second connection portion 130, the second sticking layer 133 is particularly thick. Therefore, the second connection portion 130 including the second conductive portion 31b protrudes from the second surface of the dielectric layer 11 to the surface normal direction. Then, the protrusion directions of the first conductive portion 21b and the second conductive portion 31b are opposite.

Here, the terminal portion 10b includes the deformation allowable portion 10b3 in the boundary portion between the first terminal portion 10b1 and the second terminal portion 10b2. That is, the deformation allowable portion 10b3 is formed in the boundary portion between the first conductive portion 21b and the second conductive portion 31b in the offset direction. The deformation allowable portion 10b3 allows the first terminal portion 10b1 and the second terminal portion 10b2 to relatively move toward the surface normal direction.

Specifically, in the surface normal direction of the sheet body portion 10 (the thickness direction of the dielectric layer 11), the first terminal portion 10b1 and the second terminal portion 10b2 are disposed in a manner that the distance between the first electrode sheet 12 in the first terminal portion 10b1 and the second electrode sheet 15 in the second terminal portion 10b2 is shorter than the facing distance D (shown in FIG. 23) between the first electrode sheet 12 and the second electrode sheet 15 in the transducer portion 10a corresponding to the state before deformation performed by the deformation allowable portion 10b3.

Particularly, in the surface normal direction of the sheet body portion 10, the distance between the first conductive portion 21b and the second conductive portion 31b is made shorter than the facing distance D between the first electrode sheet 12 and the second electrode sheet 15 before deformation.

Here, in this example, the deformation allowable portion 10b3 is a slit cut from the first surface over the second surface of the dielectric layer 11. Then, as shown in FIG. 23, the abutting surfaces forming the slit are staggered in the thickness direction of the dielectric layer 11. In other words, compared with the facing distance D between the first electrode sheet 12 and the second electrode sheet 15 in the transducer portion 10a corresponding to the state before deformation performed by the deformation allowable portion 10b3, the distance between the first conductive portion 21b and the second conductive portion 31b in the thickness direction of the dielectric layer 11 is shortened.

As described above, the first conductive portion 21b and the second conductive portion 31b are offset in the plane direction, and the dielectric layer 11 includes the deformation allowable portion 10b3. The deformation allowable portion 10b3 acts to bring the first conductive portion 21b and the second conductive portion 31b close to each other in the thickness direction of the dielectric layer 11. In other words, the site of the dielectric layer 11 facing the first conductive portion 21b and the site of the dielectric layer 11 facing the second conductive portion 31b are not located on the same plane, and deviate in the thickness direction of the dielectric layer 11.

Accordingly, the range in the thickness direction of a site including the first conductive portion 21b, the first electrode sheet 12, and the dielectric layer 11 overlaps the range in the thickness direction of a site including the second conductive portion 31b, the second electrode sheet 15, and the dielectric layer 11 in most part. Particularly, a first electrically conductive range configured including the first electrode sheet 12 and the first conductive portion 21b overlaps a second electrically conductive range configured including the second electrode sheet 15 and the second conductive portion 31b in most part in the thickness direction of the dielectric layer 11.

In other words, even when the first leading wire 21 and the second leading wire 31 are disposed on the opposite sides of the sheet body portion 10, the thickness H of the entire terminal portion 10b is reduced. As a result, the maximum thickness of the entire electrostatic sheet constituting the transducer 1 can be reduced.

Furthermore, the second electrode sheet 15 is disposed in the central portion of the second terminal portion 10b2, and is not disposed at the edge on the slit side in the second terminal portion 10b2. On the other hand, the first electrode sheet 12 is disposed over the first terminal portion 10b1 and the second terminal portion 10b2. Accordingly, around the slit (at the edge forming the slit), only the first electrode sheet 12 is disposed, and the second electrode sheet 15 is not disposed. Accordingly, when the first terminal portion 10b1 and the second terminal portion 10b2 deviate in the thickness direction, the first electrode sheet 12 and the second electrode sheet 15 are prevented from coming into contact with each other.

In addition, although not shown, when the first electrode sheet 12 is not disposed and only the second electrode sheet 15 is disposed around the slit, the same effect as described above can also be obtained. In addition, although not shown, when the first electrode sheet 12 and the second electrode sheet 15 are not disposed around the slit, the same effect as described above can also be obtained.

15. Transducer 400 of Fifth Example

Figure 24:
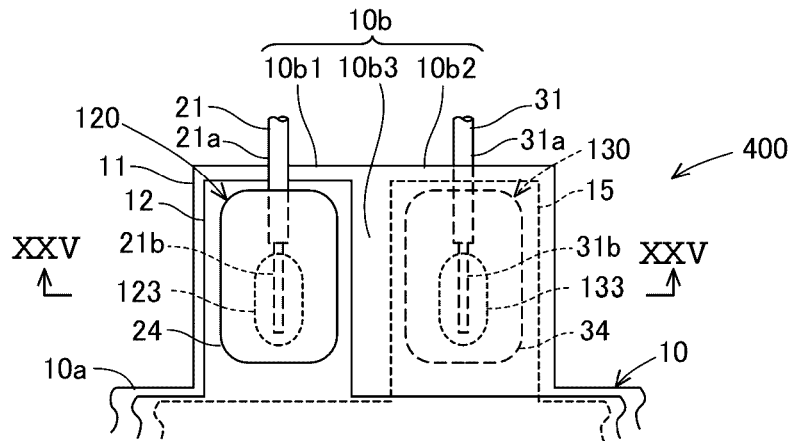
FIG. 24 is a schematic plan view of a terminal portion in an electrostatic sheet constituting a transducer 400 of a fifth example.
Figure 25:
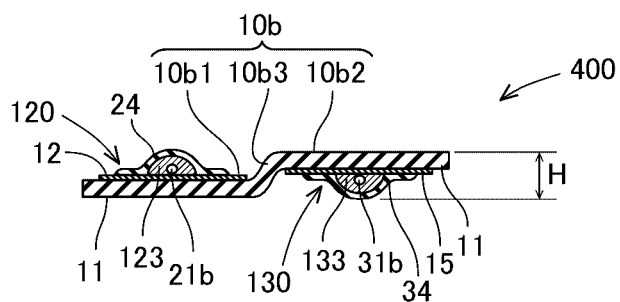
FIG. 25 is a cross-sectional view taken along a line XXV-XXV in FIG. 24.

The electrostatic sheet constituting a transducer 400 of a fifth example is described with reference to FIG. 24. The transducer 400 of the fifth example is different from the transducer 300 of the fourth example in terms of the deformation allowable portion 10b3.

In this example, the deformation allowable portion 10b3 is configured by bending deformation of the dielectric layer 11 formed of an elastomer. The dielectric layer 11 of the first terminal portion 10b1 and the dielectric layer 11 of the second terminal portion 10b2 are continuously connected by the dielectric layer 11 of the deformation allowable portion 10b3. The deformation allowable portion 10b3 is deformed and formed in step by the bending deformation of the dielectric layer 11.

In this way, the deformation allowable portion 10b3 can dispose the first terminal portion 10b1 and the second terminal portion 10b2 in the surface normal direction of the sheet body portion 10 (the thickness direction of the dielectric layer 11) in a manner that the distance between the first electrode sheet 12 in the first terminal portion 10b1 and the second electrode sheet 15 in the second terminal portion 10b2 is shorter than the facing distance D between the first electrode sheet 12 and the second electrode sheet 15 in the transducer portion 10a corresponding to the state before deformation performed by the deformation allowable portion 10b3.

Particularly, in the surface normal direction of the sheet body portion 10, the distance between the first conductive portion 21b and the second conductive portion 31b is made shorter than the facing distance D between the first electrode sheet 12 and the second electrode sheet 15 in the transducer portion 10a corresponding to the state before deformation performed by the deformation allowable portion 10b3.

Accordingly, even when the first leading wire 21 and the second leading wire 31 are disposed on the opposite sides of the dielectric layer 11, the thickness H of the entire terminal portion 10b is reduced. As a result, the maximum thickness of the entire electrostatic sheet constituting the transducer 1 can be reduced.

Furthermore, the first electrode sheet 12 is disposed in the first terminal portion 10b1 and is not disposed in the second terminal portion 10b2. On the other hand, the second electrode sheet 15 is not disposed in the first terminal portion 10b1 and is disposed in the second terminal portion 10b2. Accordingly, the first electrode sheet 12 is disposed in the first terminal portion 10b1 only and the second electrode sheet 15 is disposed in the second terminal portion 10b2 only, and thereby the thickness H of the entire terminal portion 10b is further reduced.

In addition, when a long distance between the first terminal portion 10b1 and the second terminal portion 10b2 can be secured in the plane direction of the sheet body portion 10, the deformation allowable portion 10b3 of this example is suitable. In this case, a large deviation between the dielectric layer 11 of the first terminal portion 10b1 and the dielectric layer 11 of the second terminal portion 10b2 can be ensured, and the shape of the dielectric layer 11 is a simple shape.

Besides, in this example, the first connection portion 120 and the second connection portion 130 may not have the first fusion restriction layer 22 and the second fusion restriction layer 32 either. In addition, the first connection protective layer 24 and the second connection protective layer 34 can also use, in addition to the thermoplastic material, an insulating sheet made of resin which has an adhesive layer or a bonding layer.

16. Transducer 500 of Sixth Example

Figure 26:
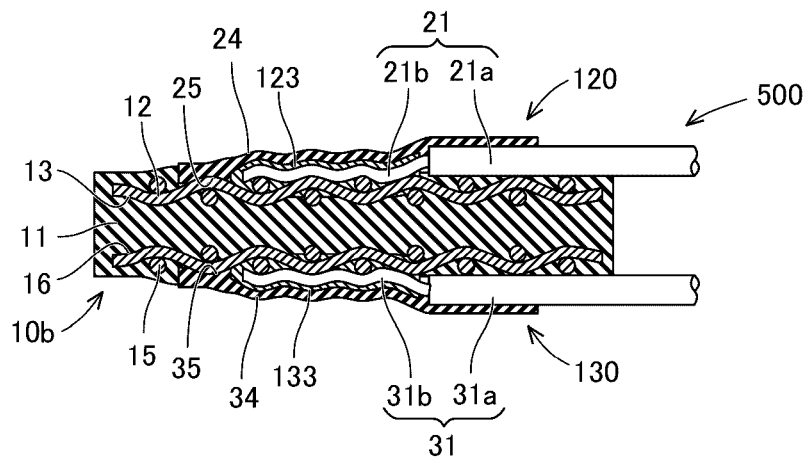
FIG. 26 is a cross-sectional view of a terminal portion in an electrostatic sheet constituting a transducer 500 of the sixth example.

The electrostatic sheet constituting a transducer 500 of a sixth example is described with reference to FIG. 26. Compared with the transducer 100 of the second example, the transducer 500 of the sixth example does not include the first fusion restriction layer 22 or the second fusion restriction layer 32, and the first connection portion 20 and the second connection portion 30 are disposed without offset in the terminal portion 10b of the sheet body portion 10. However, the first connection portion 20 and the second connection portion 30 may also be disposed offset.

Figure 27:
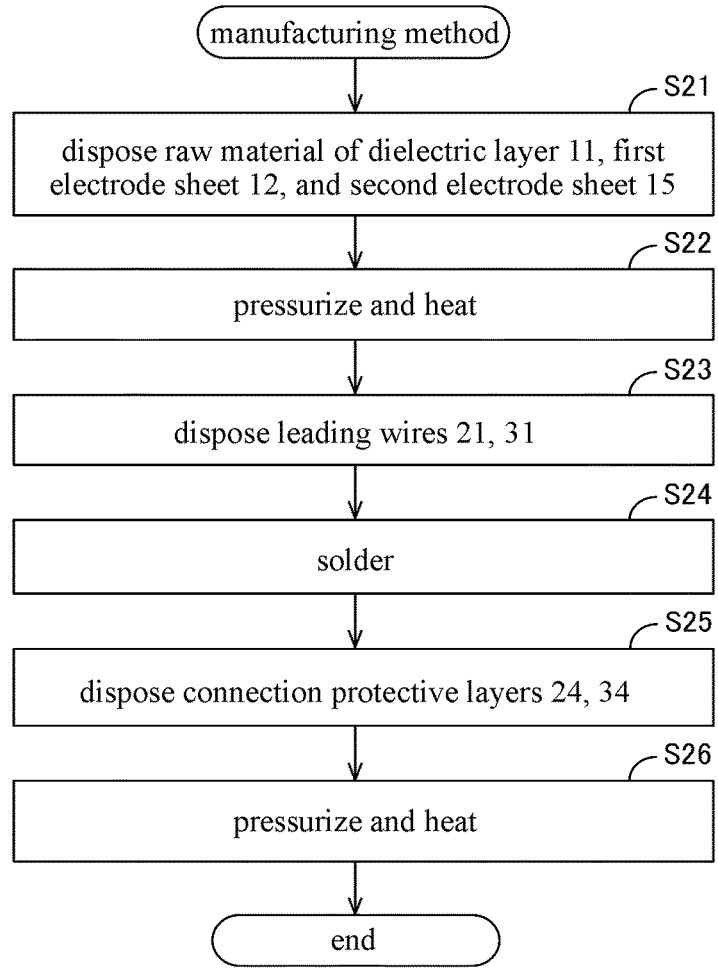
FIG. 27 is a flowchart showing a manufacturing method of the electrostatic sheet constituting the transducer 500 of the sixth example.

A manufacturing method of the electrostatic sheet constituting the transducer 500 of the sixth example is described with reference to FIG. 27. First, the raw material of the dielectric layer 11, the first electrode sheet 12, and the second electrode sheet 15 are disposed at predetermined positions (S21). Specifically, the first electrode sheet 12 is disposed on the first surface side of the raw material of the dielectric layer 11, and the second electrode sheet 15 is disposed on the second surface side of the raw material of the dielectric layer 11.

Subsequently, the entire laminate is heated while being pressurized in the thickness direction (S22). Thereby, a part of the raw material of the dielectric layer 11 formed of a thermoplastic elastomer is melted, and the first electrode sheet 12 is embedded on the first surface side of the raw material of the dielectric layer 11. In this way, a part of the raw material of the dielectric layer 11 forms the first main fusion layer 13 and joins the dielectric layer 11 and the first electrode sheet 12. In addition, the other part of the dielectric layer 11 formed of a thermoplastic elastomer is melted, and the second electrode sheet 15 is embedded on the second surface side of the raw material of the dielectric layer 11. In this way, the other part of the raw material of the dielectric layer 11 forms the second main fusion layer 16, and the dielectric layer 11 and the second electrode sheet 15 are joined.

Subsequently, the first leading wire 21 is disposed on the first electrode sheet 12 side, and the second leading wire 31 is disposed on the second electrode sheet 15 side (S23). Subsequently, the connection region between the first conductive portion 21b of the first leading wire 21 and the first electrode sheet 12 are subjected to soldering, and thereby the first sticking layer 123 is formed (S24). Furthermore, the connection region between the second conductive portion 31b of the second leading wire 31 and the second electrode sheet 15 are subjected to soldering, and thereby the second sticking layer 133 is formed (S24).

Subsequently, the raw material of the first connection protective layer 24 is disposed to cover the first conductive portion 21b of the first leading wire 21 and the first sticking layer 123, and the raw material of the second connection protective layer 34 is disposed to cover the second conductive portion 31b of the second leading wire 31 and the second sticking layer 133 (S25).

Subsequently, the part of the raw materials of the connection protective layers 24, 34 is pressurized in the thickness direction and heated (S26). Thereby, a part of the raw material of the first connection protective layer 24 formed of a thermoplastic elastomer and a part of the dielectric layer 11 are melted, and the first connection fusion layer 25 that is the melted part joins the dielectric layer 11, the first electrode sheet 12, the first leading wire 21, the first sticking layer 123, and the first connection protective layer 24.

Furthermore, a part of the raw material of the second connection protective layer 34 formed of a thermoplastic elastomer and a part of the dielectric layer 11 are melted, and the second connection fusion layer 35 that is the melted part joins the dielectric layer 11, the second electrode sheet 15, the second leading wire 31, the second sticking layer 133, and the second connection protective layer 34.

According to the above, the first leading wire 21 and the first connection protective layer 24 are disposed on the side of a surface (first outer surface 12c) of the first electrode sheet 12 opposite to the dielectric layer 11. Accordingly, the first leading wire 21 and the first connection protective layer 24 are joined to the first electrode sheet 12 functioning as the transducer 500 instead of being joined to an electrode drawn outside. Accordingly, since the external electrode is not required, the manufacturing cost of the transducer 500 can be reduced.

Here, the boundary site between the dielectric layer 11 and the first connection protective layer 24, which is a site formed through the first through holes 12a of the first electrode sheet 12, is joined by fusion of the fusion material. The fusion material here is at least one of a part of the dielectric layer 11 and a part of the first connection protective layer 24. In other words, the both are joined without using a volatile adhesive or an organic solvent. Accordingly, VOC emission can be suppressed.

Furthermore, the first connection protective layer 24 and the dielectric layer 11 are joined by the fusion material (using a part of each). This configuration can be implemented by disposing the first leading wire 21 and the first connection protective layer 24 on the side of the surface (first outer surface 12c) of the first electrode sheet 12 opposite to the dielectric layer 11. In this case, the first electrode sheet 12 and the first leading wire 21 are interposed between the first connection protective layer 24 and the dielectric layer 11. However, the first electrode sheet 12 has the first through holes 12a, and thus the first connection protective layer 24 and the dielectric layer 11 can be joined via the first electrode sheet 12 and the first leading wire 21.

In other words, a part of the first electrode sheet 12 and the first conductive portion 21b of the first leading wire 21 are embedded in the first connection protective layer 24 and the dielectric layer 11 that are joined. Accordingly, the first electrode sheet 12 and the first leading wire 21 are reliably maintained in an electrically connected state. In addition, the state in which the first electrode sheet 12 is joined to the dielectric layer 11 can be maintained.

Furthermore, the boundary site between the first electrode sheet 12 and the first connection protective layer 24 are joined by fusion of the fusion material. The fusion material here is a part of the raw material of the first connection protective layer 24. In this case, similar to the above, the both are also joined without using a volatile adhesive or an organic solvent. Accordingly, VOC emission can be suppressed.

Furthermore, the first connection protective layer 24 and the first electrode sheet 12 are joined by fusion of the fusion material. The fusion material here is a part of the raw material of the first connection protective layer 24. Then, the fused site of the first electrode sheet 12 includes the inner peripheral surface of the first through holes 12a of the first electrode sheet 12. By fusion of the fusion material (using a part of the first connection protective layer 24), the first connection protective layer 24 is joined to the first outer surface 12c and the inner peripheral surfaces of the first through holes 12a in the first electrode sheet 12. Accordingly, the first connection protective layer 24 and the first electrode sheet 12 are joined in a wide range.

The first conductive portion 21b of the first leading wire 21 exists between the first connection protective layer 24 and the first electrode sheet 12 that are joined in this manner. In other words, the first conductive portion 21b of the first leading wire 21 is embedded in the first connection protective layer 24 and the first electrode sheet 12 that are joined. Accordingly, the first electrode sheet 12 and the first leading wire 21 are reliably maintained in an electrically connected state. Besides, the first electrode sheet 12 side is described above, but the same applies to the second electrode sheet 15 side.

In addition, in the region where the first connection protective layer 24 and the second connection protective layer 34 do not exist, the dielectric layer 11 and the first electrode sheet 12 are joined by fusion of the fusion material, and the dielectric layer 11 and the second electrode sheet 15 are joined by fusion of the fusion material. The fusion material here is a part of the dielectric layer 11.

Then, the site fused with the first electrode sheet 12 includes the first inner surface 12b of the first electrode sheet 12 and the inner peripheral surfaces of the first through holes 12a of the first electrode sheet 12. The site fused with the second electrode sheet 15 includes the second inner surface 15b of the second electrode sheet 15 and the inner peripheral surfaces of the second through holes 15a of the second electrode sheet 15. In this case, similar to the above, the both are also joined without using a volatile adhesive or an organic solvent. Accordingly, VOC emission can be suppressed. Besides, by using the inner peripheral surfaces of the first through holes 12a and the inner peripheral surfaces of the second through holes 15a as the fused sites, the both are joined more firmly.

Besides, the first connection protective layer 24 and the second connection protective layer 34 can use an insulating sheet made of resin which has an adhesive layer or a bonding layer. In this case, the first connection fusion layer 25 and the second connection fusion layer 35 are not included. In addition, the first connection protective layer 24 and the second connection protective layer 34 can be pasted without heating.

17. Transducer 600 of Seventh Example

Figure 28:
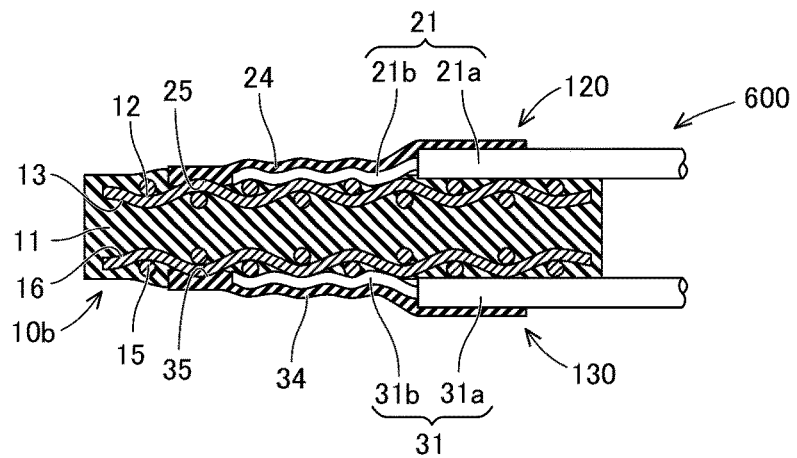
FIG. 28 is a cross-sectional view of a terminal portion in an electrostatic sheet constituting a transducer 600 of the seventh example.

The electrostatic sheet constituting a transducer 600 of a seventh example is described with reference to FIG. 28. As shown in FIG. 28, the transducer 600 does not have the first sticking layer 123 or the second sticking layer 133 in the transducer 500 of the sixth example. In other words, the first connection protective layer 24 directly protects the first conductive portion 21b of the first leading wire 21, and the second connection protective layer 34 directly protects the second conductive portion 31b of the second leading wire 31. When a joining force of the first connection protective layer 24 and the second connection protective layer 34 is sufficient, this aspect can be applied.

18. Transducer 700 of Eighth Example

Figure 29:
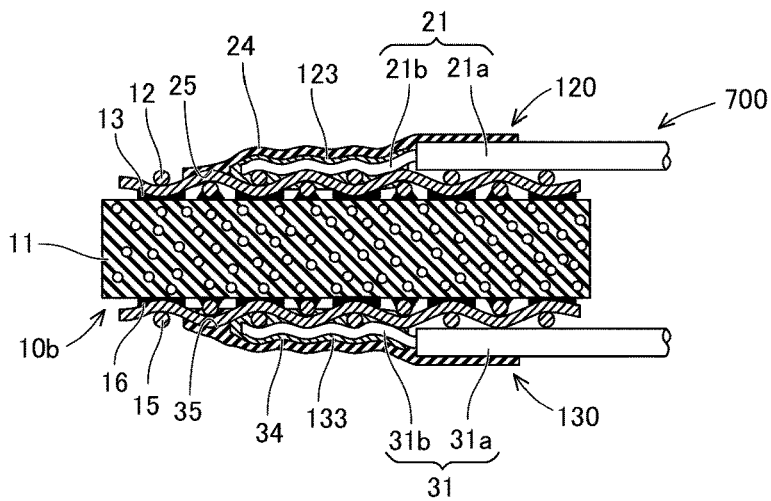
FIG. 29 is a cross-sectional view of a terminal portion in an electrostatic sheet constituting a transducer 700 of an eighth example.

The electrostatic sheet constituting a transducer 700 of an eighth example is described with reference to FIG. 29. As shown in FIG. 29, the dielectric layer 11 is formed of a non-thermoplastic material and has holes communicating in the lamination direction (thickness direction). For example, the foam material of a non-thermoplastic elastomer is used in the dielectric layer 11. Besides, in addition to the elastomer, the material having good air permeability such as a non-thermoplastic non-woven fabric or the like can also be used in the dielectric layer 11. The dielectric layer 11 is a non-thermoplastic material and thus is not melted even if heat is applied.

In addition, the transducer 700 includes the first main fusion layer 13 separate from the dielectric layer 11 and the first electrode sheet 12 between the dielectric layer 11 and the first electrode sheet 12 in order to join the dielectric layer 11 and the first electrode sheet 12. The first main fusion layer 13 joins a part of the first inner surface 12b of the first electrode sheet 12 and the dielectric layer 11, and joins a part of the inner peripheral surfaces of the first through holes 12a of the first electrode sheet 12 and the dielectric layer 11. Accordingly, the first through holes 12a of the first electrode sheet 12 are not completely closed and the state of being penetrated is maintained in at least a part of the first through holes 12a.

Furthermore, the transducer 700 includes the second main fusion layer 16 separate from the dielectric layer 11 and the second electrode sheet 15 between the dielectric layer 11 and the second electrode sheet 15 in order to join the dielectric layer 11 and the second electrode sheet 15. The second main fusion layer 16 joins a part of the second inner surface 15b of the second electrode sheet 15 and the dielectric layer 11, and joins a part of the inner peripheral surfaces of the second through holes 15a of the second electrode sheet 15 and the dielectric layer 11. Accordingly, the second through holes 15a of the second electrode sheet 15 are not completely closed and the state of being penetrated is maintained in at least a part of the second through holes 15a.

The first main fusion layer 13 and the second main fusion layer 16 are formed of a thermoplastic elastomer (fusion material). Besides, the first main fusion layer 13 and the second main fusion layer 16 are formed of, for example, a particulate raw material, melted by heating, and joined to objects by fusion. In addition, the first main fusion layer 13 and the second main fusion layer 16 are separate from the dielectric layer 11, but preferably have the same elastic modulus as that of the dielectric layer 11 in a solidified state.

As described above, the dielectric layer 11 has the holes communicating in the lamination direction, and at least a part of the first through holes 12a of the first electrode sheet 12 is not closed and at least a part of the second through holes 15a of the second electrode sheet 15 is not closed. Accordingly, the laminate configured by the dielectric layer 11, the first electrode sheet 12, and the second electrode sheet 15 has air permeability in the lamination direction. Accordingly, the transducer 700 is preferably applied to a site requiring air permeability.

Here, the first connection protective layer 24 and the second connection protective layer 34 are the same as in the first example. Accordingly, the first connection protective layer 24 is joined to the dielectric layer 11, the first electrode sheet 12, the first leading wire 21, and the first sticking layer 123 by the fusion of the first connection protective layer 24. In addition, the second connection protective layer 34 is joined to the dielectric layer 11, the second electrode sheet 15, the second leading wire 31, and the second sticking layer 133 by the fusion of the second connection protective layer 34. In this example, the first connection fusion layer 25 is configured by only a part of the first connection protective layer 24, and the second connection fusion layer 35 is configured by only a part of the second connection protective layer 34.

Figure 30:
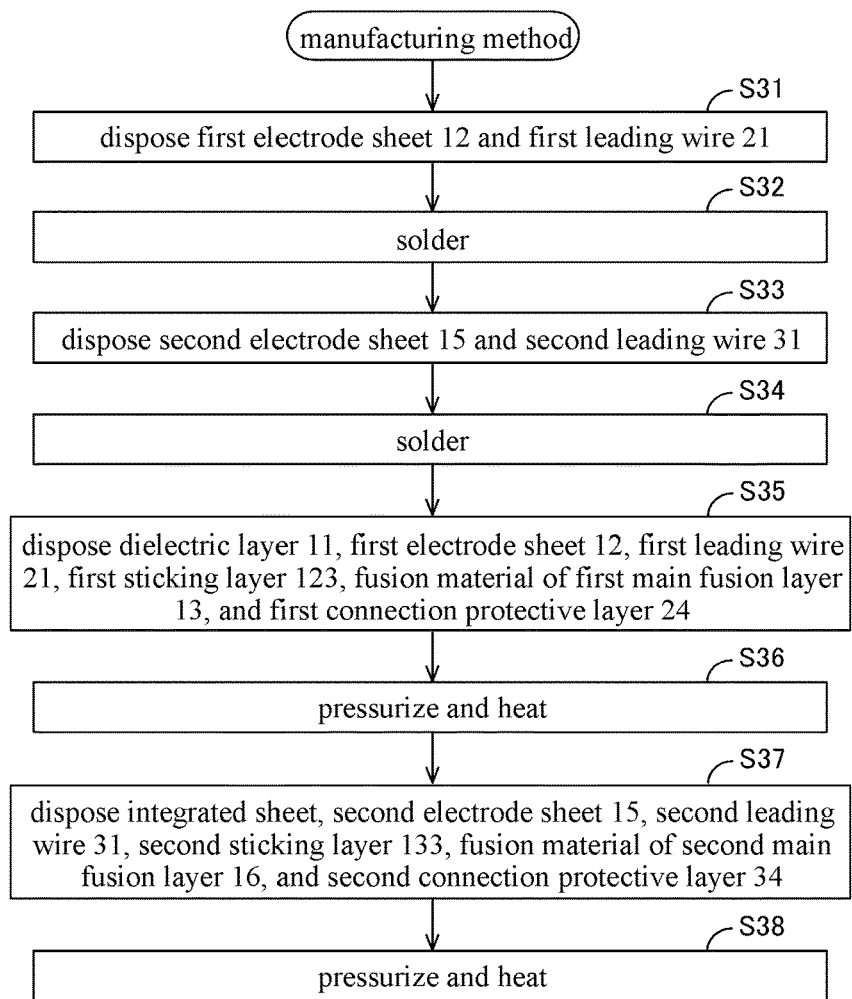
FIG. 30 is a flowchart showing a manufacturing method of the electrostatic sheet constituting the transducer 700 of the eighth example.

Next, a manufacturing method of the electrostatic sheet constituting the transducer 700 is described with reference to FIG. 30. The first electrode sheet 12 and the first leading wire 21 are disposed at predetermined positions (S31), and soldering is performed (S32). In this way, the first sticking layer 123 is formed. Subsequently, the second electrode sheet 15 and the second leading wire 31 are disposed at predetermined positions (S33), and soldering is performed (S34). In this way, the second sticking layer 133 is formed.

Subsequently, the dielectric layer 11, the first electrode sheet 12, the first leading wire 21, the first sticking layer 123, the fusion material of the first main fusion layer 13, and the first connection protective layer 24 are disposed at predetermined positions (S35). Then, the entire sheet is pressurized in the thickness direction and heated (S36). Thereby, the fusion material of the first main fusion layer 13 formed of a thermoplastic elastomer and a part of the first connection protective layer 24 are melted, and the dielectric layer 11, the first electrode sheet 12, the first leading wire 21, the first sticking layer 123, the first main fusion layer 13, and the first connection protective layer 24 are joined by the fusion of the first main fusion layer 13 and the first connection protective layer 24.

Subsequently, the sheet integrated in S36, the second electrode sheet 15, the second leading wire 31, the second sticking layer 133, the fusion material of the second main fusion layer 16, and the second connection protective layer 34 are disposed at predetermined positions (S37). Then, the entire sheet is pressurized in the thickness direction and heated (S38). Thereby, the fusion material of the second main fusion layer 16 formed of a thermoplastic elastomer and a part of the second connection protective layer 34 are melted, and the integrated sheet, the second electrode sheet 15, the second leading wire 31, the second sticking layer 133, the second main fusion layer 16, and the second connection protective layer 34 are joined by the fusion of the second main fusion layer 16 and the second connection protective layer 34.

Besides, the first connection protective layer 24 and the second connection protective layer 34 can use an insulating sheet made of resin which has an adhesive layer or a bonding layer. In this case, the first connection fusion layer 25 and the second connection fusion layer 35 are not included. In addition, the first connection protective layer 24 and the second connection protective layer 34 can be pasted without heating.

19. Transducer 800 of Ninth Example

Figure 31:
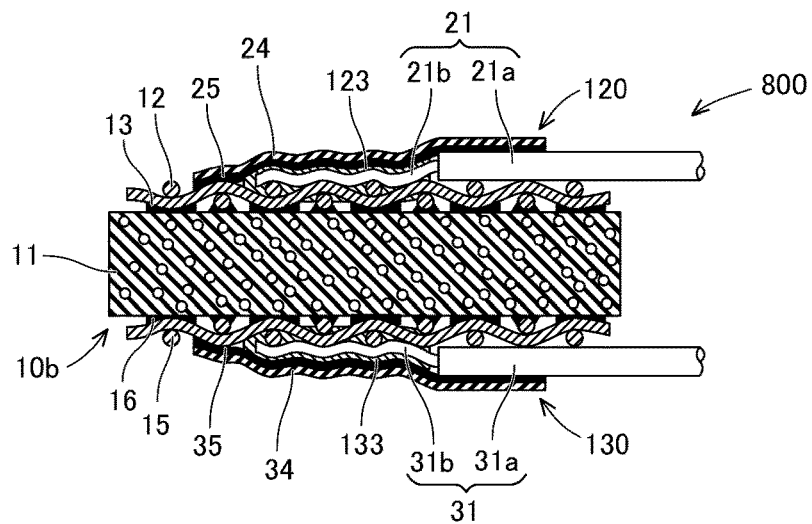
FIG. 31 is a cross-sectional view of a terminal portion in an electrostatic sheet constituting a transducer 800 of a ninth example.

The electrostatic sheet constituting a transducer 800 of a ninth example is described with reference to FIG. 31. As shown in FIG. 31, similar to the dielectric layer 11 in the transducer 700 of the eighth example, the dielectric layer 11 is formed of a non-thermoplastic material and has holes communicating in the lamination direction (thickness direction). Furthermore, similar to the transducer 700 of the eighth example, the transducer 800 includes the first main fusion layer 13 and the second main fusion layer 16.

In addition, in this example, the first connection protective layer 24 and the second connection protective layer 34 are formed of a non-thermoplastic material. In other words, similar to the dielectric layer 11, the first connection protective layer 24 and the second connection protective layer 34 are not melted even if heat is applied.

In addition, the transducer 800 includes the first connection fusion layer 25 which is a material different from the dielectric layer 11 and the first connection protective layer 24 in order to join the first connection protective layer 24 and other members. Furthermore, the transducer 800 includes the second connection fusion layer 35 which is a material different from the dielectric layer 11 and the second connection protective layer 34 in order to join the second connection protective layer 34 and other members.

The first connection fusion layer 25 and the second connection fusion layer 35 are formed of a thermoplastic elastomer (fusion material). Besides, the first connection fusion layer 25 and the second connection fusion layer 35 are formed of, for example, a particulate raw material, melted by heating, and joined to objects by fusion. In addition, the first connection fusion layer 25 and the second connection fusion layer 35 are separate from the dielectric layer 11, the first connection protective layer 24, and the second connection protective layer 34, but preferably have the same elastic modulus as these layers in a solidified state.

Figure 32A:
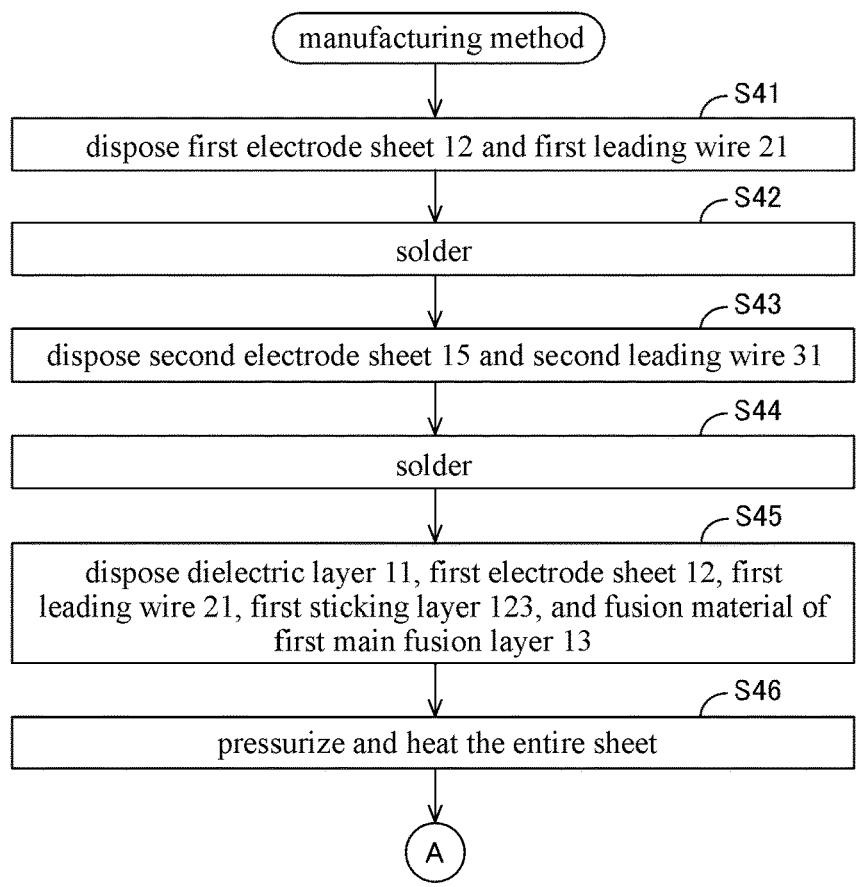
FIG. 32A is a flowchart showing a manufacturing method of the electrostatic sheet constituting the transducer 800 of the ninth example.
Figure 32B:
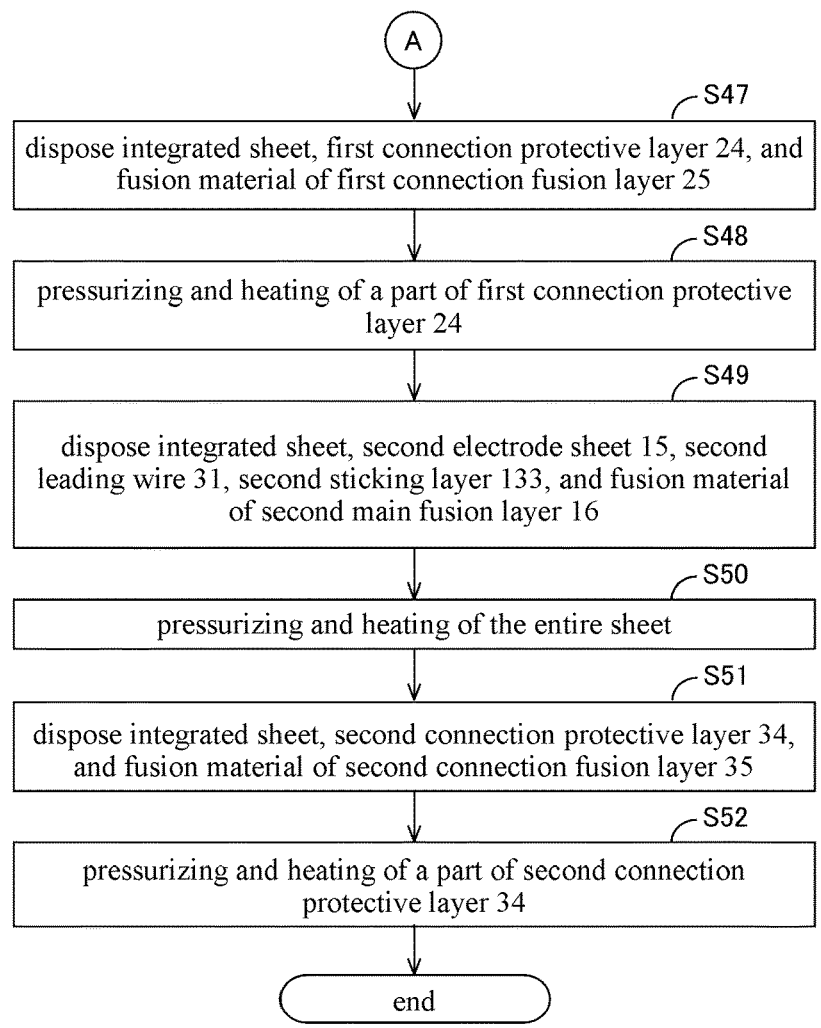
FIG. 32B is a flowchart showing the manufacturing method of the electrostatic sheet constituting the transducer 800 of the ninth example.

Next, a manufacturing method of the electrostatic sheet constituting the transducer 800 is described with reference to FIGS. 32A and 32B. The first electrode sheet 12 and the first leading wire 21 are disposed at predetermined positions (S41), and soldering is performed (S42). In this way, the first sticking layer 123 is formed. Subsequently, the second electrode sheet 15 and the second leading wire 31 are disposed at predetermined positions (S43), and soldering is performed (S44). In this way, the second sticking layer 133 is formed.

Subsequently, the dielectric layer 11, the first electrode sheet 12, the first leading wire 21, the first sticking layer 123, and the fusion material of the first main fusion layer 13 are disposed at predetermined positions (S45). Then, the entire sheet is pressurized in the thickness direction and heated (S46). Thereby, the fusion material of the first main fusion layer 13 formed of a thermoplastic elastomer is melted, and the dielectric layer 11, the first electrode sheet 12, the first leading wire 21, the first sticking layer 123 and the first main fusion layer 13 are joined by the fusion of the first main fusion layer 13.

Subsequently, the sheet integrated in S46, the first connection protective layer 24, and the fusion material of the first connection fusion layer 25 are disposed (S47). Then, the part of the first connection protective layer 24 is pressurized in the thickness direction and heated (S48). Thereby, the fusion material of the first connection fusion layer 25 formed of a thermoplastic elastomer is melted, and the respective members are joined by the fusion of the first connection fusion layer 25.

Subsequently, the sheet integrated in S48, the second electrode sheet 15, the second leading wire 31, the second sticking layer 133, and the fusion material of the second main fusion layer 16 are disposed at predetermined positions (S49). Then, the entire sheet is pressurized in the thickness direction and heated (S50). Thereby, the fusion material of the second main fusion layer 16 formed of a thermoplastic elastomer is melted, and the respective members are joined by the fusion of the second main fusion layer 16.

Subsequently, the sheet integrated in S50, the second connection protective layer 34, and the fusion material of the second connection fusion layer 35 are disposed at predetermined positions (S51). Then, the part of the second connection protective layer 34 is pressurized in the thickness direction and heated (S52). Thereby, the fusion material of the second connection fusion layer 35 formed of a thermoplastic elastomer is melted, and the respective members are joined by the fusion of the second connection fusion layer 35.

20. Transducer 900 of Tenth Example

Figure 33:
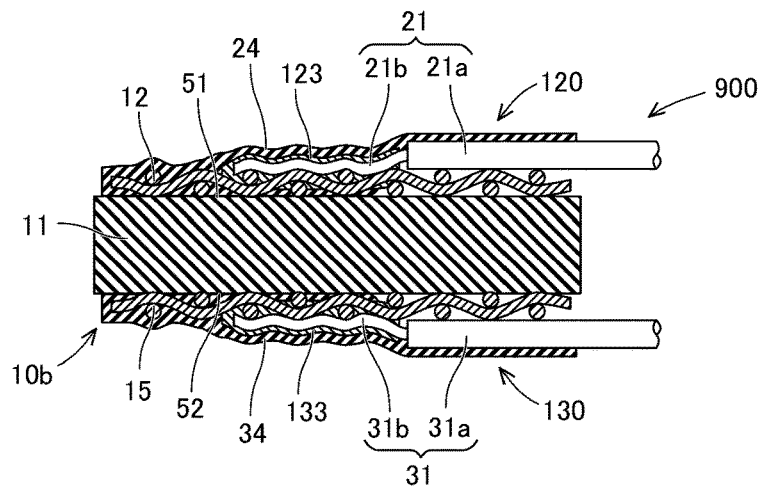
FIG. 33 is a cross-sectional view of a terminal portion in an electrostatic sheet constituting a transducer 900 of a tenth example.

The electrostatic sheet constituting a transducer 900 of a tenth example is described with reference to FIG. 33. As shown in FIG. 33, the dielectric layer 11 is formed of a non-thermoplastic elastomer. In addition, the first connection protective layer 24 and the second connection protective layer 34 is formed of a thermoplastic elastomer, and are formed in substantially the same outer shape as that of the dielectric layer 11 in the terminal portion 10b.

The first connection protective layer 24 is joined to the dielectric layer 11, the first electrode sheet 12, the first leading wire 21, and the first sticking layer 123 by the fusion of the first connection protective layer 24. In other words, a part of the first connection protective layer 24 becomes the first fusion layer 51. The first fusion layer 51 functions as the first main fusion layer that joins the dielectric layer 11 and the first electrode sheet 12, and functions as the first connection fusion layer that protects the first leading wire 21 and the first sticking layer 123.

In addition, the second connection protective layer 34 is joined to the dielectric layer 11, the second electrode sheet 15, the second leading wire 31, and the second sticking layer 133 by the fusion of the second connection protective layer 34. In other words, a part of the second connection protective layer 34 becomes the second fusion layer 52. The second fusion layer 52 functions as the second main fusion layer that joins the dielectric layer 11 and the second electrode sheet 15, and functions the second connection fusion layer that protects the second leading wire 31 and the second sticking layer 133.

Figure 34:
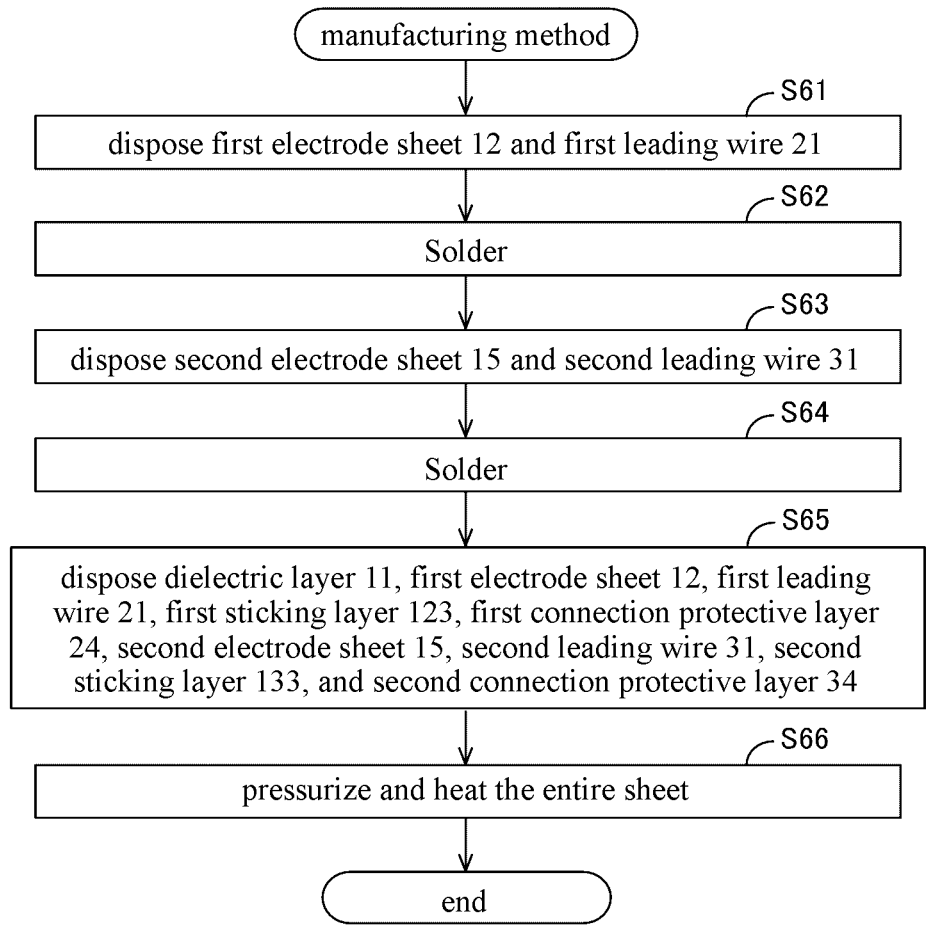
FIG. 34 is a flowchart showing a manufacturing method of the electrostatic sheet constituting the transducer 900 of the tenth example.

Next, a manufacturing method of the electrostatic sheet constituting the transducer 900 is described with reference to FIG. 34. The first electrode sheet 12 and the first leading wire 21 are disposed at predetermined positions (S61), and soldering is performed (S62). In this way, the first sticking layer 123 is formed. Subsequently, the second electrode sheet 15 and the second leading wire 31 are disposed at predetermined positions (S63), and soldering is performed (S64). In this way, the second sticking layer 133 is formed.

Subsequently, the dielectric layer 11, the first electrode sheet 12, the first leading wire 21, the first sticking layer 123, the first connection protective layer 24, the second electrode sheet 15, the second leading wire 31, the second sticking layer 133, and the second connection protective layer 34 are disposed at predetermined positions (S65). Then, the entire sheet is pressurized in the thickness direction and heated (S66). Thereby, the fusion material of the first connection protective layer 24 formed of a thermoplastic elastomer is melted, and the respective members are joined by the fusion of the first connection protective layer 24. Furthermore, the fusion material of the second connection protective layer 34 formed of a thermoplastic elastomer is melted, and the respective members are joined by the fusion of the second connection protective layer 34.

21. Transducer 1000 of Eleventh Example

Figure 35:
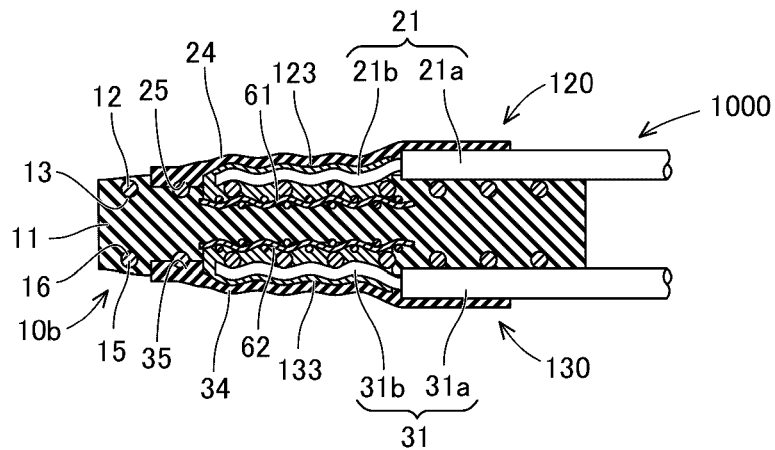
FIG. 35 is a cross-sectional view of a terminal portion in an electrostatic sheet constituting a transducer 1000 of an eleventh example.

The electrostatic sheet constituting a transducer 1000 of a tenth example is described with reference to FIG. 35. As shown in FIG. 35, compared with the transducer 500 of the sixth example, the transducer 1000 further includes a first reinforcement layer 61 and a second reinforcement layer 62.

The first reinforcement layer 61 is disposed on the first inner surface 12b side of the first electrode sheet 12, that is, between the dielectric layer 11 and the first electrode sheet 12. The first reinforcement layer 61 has a plurality of through holes smaller than the first through holes 12a of the first electrode sheet 12. Similar to the first electrode sheet 12, the first reinforcement layer 61 is a cloth formed of electrically conductive fibers, that is, an electrically conductive woven fabric or non-woven fabric. The first reinforcement layer 61 can also use a thin-film punching metal having flexibility and stretchability.

Then, the first reinforcement layer 61 is stuck to the first sticking layer 123 via the first through holes 12a of the first electrode sheet 12. In other words, the first sticking layer 123 sticks the first electrode sheet 12, the first leading wire 21, and the first reinforcement layer 61 in a state that the first electrode sheet 12 is interposed between the first leading wire 21 and the first reinforcement layer 61. Accordingly, the first leading wire 21 and the first electrode sheet 12 are firmly joined.

The second reinforcement layer 62 is disposed on the second inner surface 15b side of the second electrode sheet 15, that is, between the dielectric layer 11 and the second electrode sheet 15. The second reinforcement layer 62 has a plurality of through holes smaller than the second through holes 15a of the second electrode sheet 15. Similar to the second electrode sheet 15, the second reinforcement layer 62 is a cloth formed of an electrically conductive fiber, that is, an electrically conductive woven fabric or non-woven fabric. The second reinforcement layer 62 can also use a punching metal.

Then, the second reinforcement layer 62 is stuck to the second sticking layer 133 via the second through holes 15a of the second electrode sheet 15. In other words, the second sticking layer 133 sticks the second electrode sheet 15, the second leading wire 31, and the second reinforcement layer 62 in a state that the second electrode sheet 15 is interposed between the second leading wire 31 and the second reinforcement layer 62. Accordingly, the second leading wire 31 and the second electrode sheet 15 are firmly joined.

Figure 36:
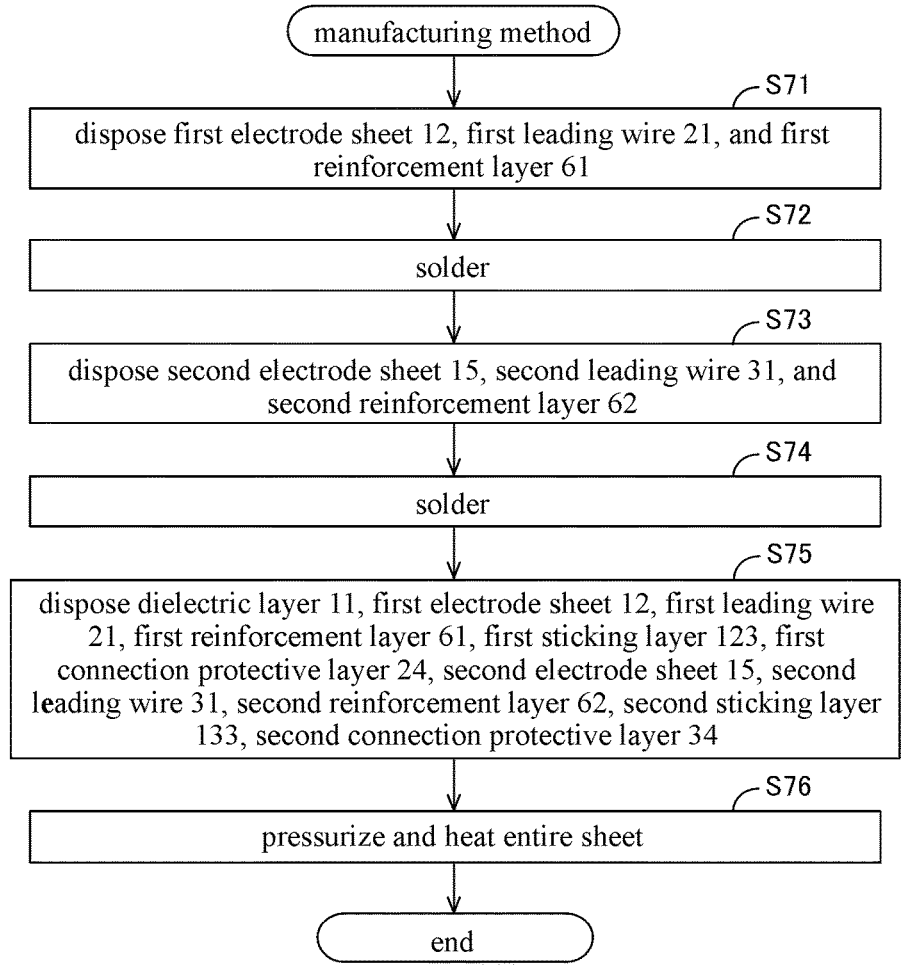
FIG. 36 is a flowchart showing a manufacturing method of the electrostatic sheet constituting the transducer 1000 of the eleventh example.

Next, a manufacturing method of the electrostatic sheet constituting the transducer 1000 is described with reference to FIG. 36. The first electrode sheet 12, the first leading wire 21, and the first reinforcement layer 61 are disposed at predetermined positions (S71), and soldering is performed (S72). In this way, the first sticking layer 123 is formed. In other words, the first sticking layer 123 firmly sticks the first leading wire 21 and the first electrode sheet 12 by utilizing the first reinforcement layer 61.

Subsequently, the second electrode sheet 15, the second leading wire 31, and the second reinforcement layer 62 are disposed at predetermined positions (S73), and soldering is performed (S74). In this way, the second sticking layer 133 is formed. In other words, the second sticking layer 133 firmly sticks the second leading wire 31 and the second electrode sheet 15 by utilizing the second reinforcement layer 62.

Subsequently, the dielectric layer 11, the first electrode sheet 12, the first leading wire 21, the first reinforcement layer 61, the first sticking layer 123, the first connection protective layer 24, the second electrode sheet 15, the second leading wire 31, the second reinforcement layer 62, the second sticking layer 133, and the second connection protective layer 34 are disposed at predetermined positions (S75). Then, the entire sheet is pressurized in the thickness direction and heated (S76). Thereby, a part of the dielectric layer 11 formed of a thermoplastic elastomer, a part of the first connection protective layer 24, and a part of the second connection protective layer 34 are melted, and the respective members are joined by the fusion of the parts.

Besides, the first reinforcement layer 61 and the second reinforcement layer 62 can be applied to the above example having the first clamp 23 and the second clamp 33. In this case, the first reinforcement layer 61 comes into direct contact with the first leg portion 23a of the first clamp 23 and comes into direct contact with the first electrode sheet 12, and thereby the electrical connection between the first electrode sheet 12 and the first conductive portion 21b can be ensured via the first clamp 23. In addition, the same applies to the second reinforcement layer 62.

Besides, the first connection protective layer 24 and the second connection protective layer 34 can use an insulating sheet made of resin which has an adhesive layer or a bonding layer. In this case, the first connection fusion layer 25 and the second connection fusion layer 35 are not included. In addition, the first connection protective layer 24 and the second connection protective layer 34 can be pasted without heating.

22. Transducer 1100 of Twelfth Example

Figure 37:
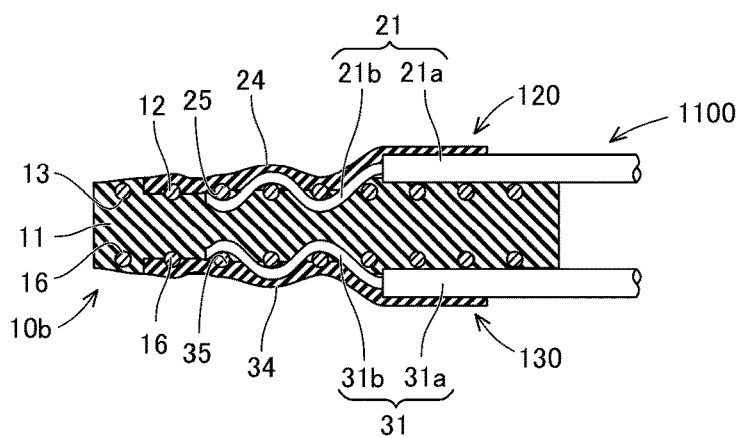
FIG. 37 is a cross-sectional view of a terminal portion in an electrostatic sheet constituting a transducer 1100 of a twelfth example.

The electrostatic sheet constituting a transducer 1100 of a twelfth example is described with reference to FIG. 37. As shown in FIG. 37, the transducer 1100 is different from the transducer 600 of the seventh example at the following points. The first conductive portion 21b of the first leading wire 21 is entangled with the first electrode sheet 12, and the second conductive portion 31b of the second leading wire 31 is entangled with the second electrode sheet 15. Other than that, the transducer 1100 and the transducer 600 are substantially the same. Thereby, the first conductive portion 21b of the first leading wire 21 is firmly joined to the first electrode sheet 12. In addition, the second conductive portion 31b of the second leading wire 31 is firmly joined to the second electrode sheet 15.

Figure 38:
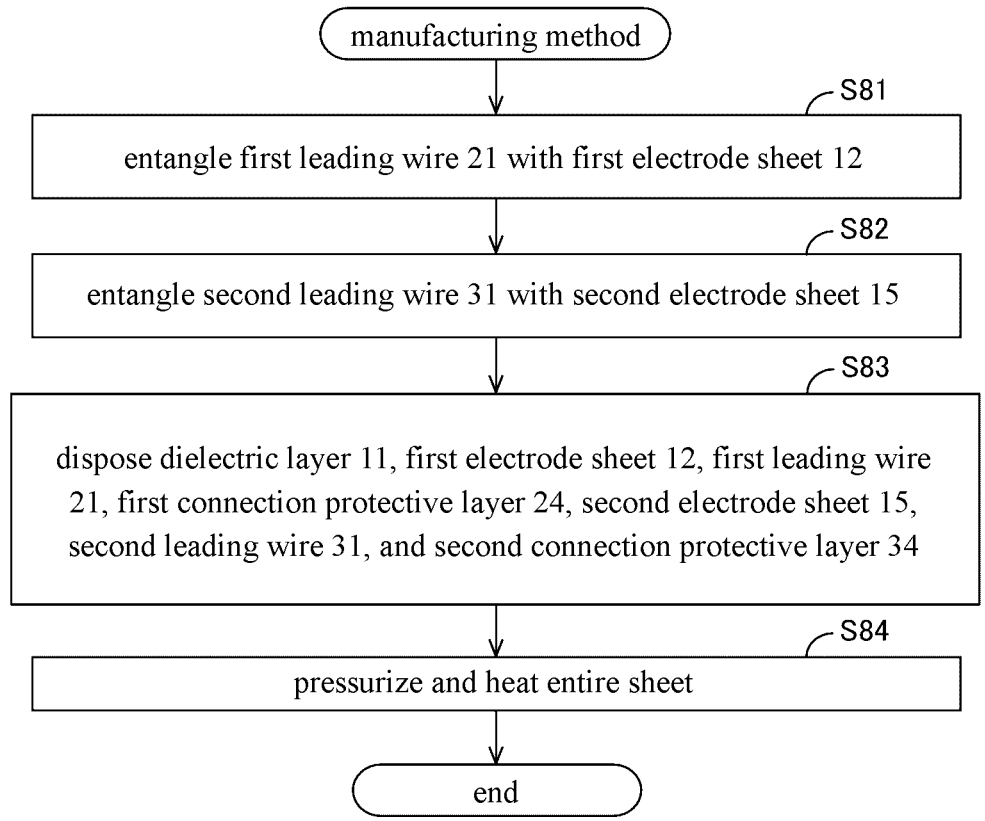
FIG. 38 is a flowchart showing a manufacturing method of the electrostatic sheet constituting the transducer 1100 of the twelfth example.

A manufacturing method of the electrostatic sheet constituting the transducer 1100 is described with reference to FIG. 38. The first leading wire 21 is disposed to be entangled with the first electrode sheet 12 (S81). Subsequently, the second leading wire 31 is disposed to be entangled with the second electrode sheet 15 (S82). Subsequently, the dielectric layer 11, the first electrode sheet 12, the first leading wire 21, the first connection protective layer 24, the second electrode sheet 15, the second leading wire 31, and the second connection protective layer 34 are disposed at predetermined positions (S83).

Subsequently, the entire sheet is pressurized in the thickness direction and heated (S84). Thereby, a part of the dielectric layer 11 formed of a thermoplastic elastomer, a part of the first connection protective layer 24, and a part of the second connection protective layer 34 are melted, and the respective members are joined by the fusion of the parts.

23. Transducer 1200 of Thirteenth Example

Figure 39:
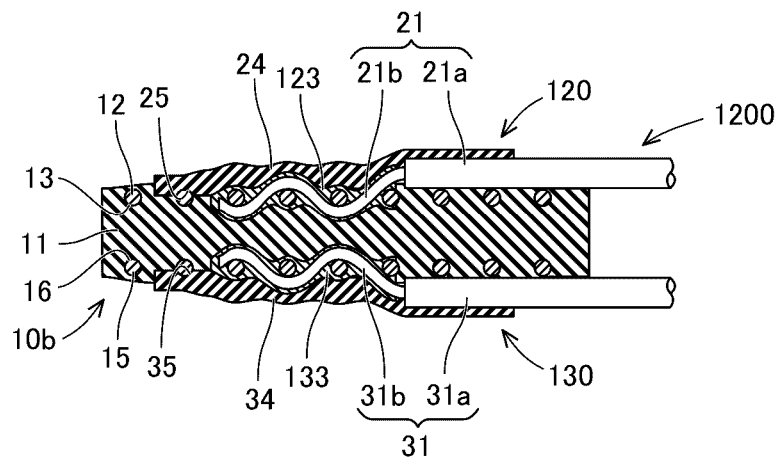
FIG. 39 is a cross-sectional view of a terminal portion in an electrostatic sheet constituting a transducer 1200 of a thirteenth example.

The electrostatic sheet constituting a transducer 1200 of a thirteenth example is described with reference to FIG. 39. As shown in FIG. 39, the transducer 1200 is different from the transducer 500 of the sixth example at the following points. The first conductive portion 21b of the first leading wire 21 is entangled with the first electrode sheet 12, and the first sticking layer 123 sticks the first conductive portion 21b of the first leading wire 21 and the first electrode sheet 12 in this state. Furthermore, the second conductive portion 31b of the second leading wire 31 is entangled with the second electrode sheet 15, and the second sticking layer 133 sticks the second conductive portion 31b of the second leading wire 31 and the second electrode sheet 15 in this state. Other than that, the transducer 1200 and the transducer 500 are substantially the same. Thereby, the first conductive portion 21b of the first leading wire 21 is firmly joined to the first electrode sheet 12. In addition, the second conductive portion 31b of the second leading wire 31 is firmly joined to the second electrode sheet 15.

Figure 40:
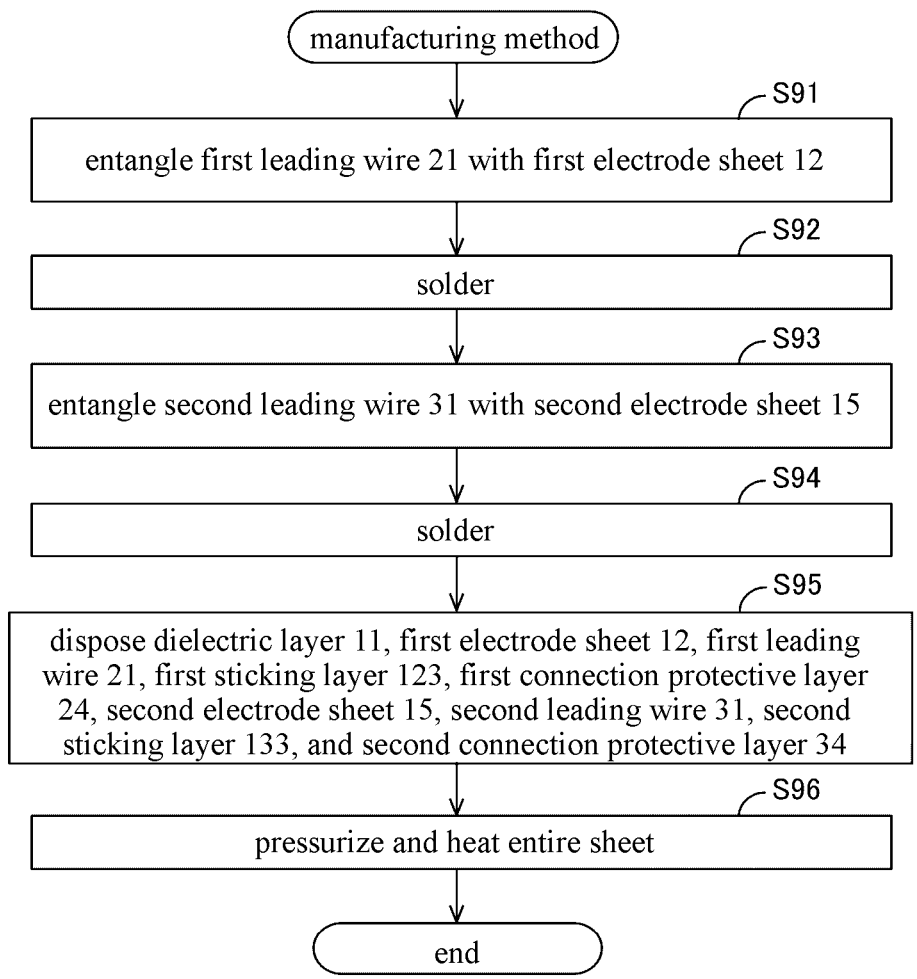
FIG. 40 is a flowchart showing a manufacturing method of the electrostatic sheet constituting the transducer 1200 of the thirteenth example.

A manufacturing method of the electrostatic sheet constituting the transducer 1200 is described with reference to FIG. 40. The first conductive portion 21b of the first leading wire 21 is entangled with the first electrode sheet 12 (S91), and soldering is performed (S92). In this way, the first sticking layer 123 is formed in the state that the first conductive portion 21b of the first leading wire 21 is entangled with the first electrode sheet 12. Subsequently, the second conductive portion 31b of the second leading wire 31 is entangled with the second electrode sheet 15 (S93), and soldering is performed (S94). In this way, the second sticking layer 133 is formed in the state that the second conductive portion 31b of the second leading wire 31 is entangled with the second electrode sheet 15.

Subsequently, the dielectric layer 11, the first electrode sheet 12, the first leading wire 21, the first sticking layer 123, the first connection protective layer 24, the second electrode sheet 15, the second leading wire 31, the second sticking layer 133, and the second connection protective layer 34 are disposed at predetermined positions (S95). Then, the entire sheet is pressurized in the thickness direction and heated (S96). Thereby, a part of the dielectric layer 11 formed of a thermoplastic elastomer, a part of the first connection protective layer 24, and a part of the second connection protective layer 34 are melted, and the respective members are joined by the fusion of the parts.

ALTERNATIVES

Besides, each configuration of the above examples can be suitably replaced by each other. In this case, in the replaced configurations, effects related to the corresponding configurations are exhibited.

What is claimed is:
1. A transducer, comprising:
   a dielectric layer;
   a first electrode sheet which comprises a plurality of first through holes and is disposed on a first surface side of the dielectric layer;
   a first main fusion layer which is formed of a fusion material and disposed as at least a part on the first surface side within the dielectric layer or joined as a separate member to the first surface of the dielectric layer, and joins the dielectric layer and the first electrode sheet by fusion of the fusion material; and
   a first fusion restriction layer which is partially disposed between the first electrode sheet and the first main fusion layer, restricts the first main fusion layer from being fused to the first electrode sheet, and disposes at least a part of the first electrode sheet outside the first main fusion layer,
   wherein the first fusion restriction layer is formed of a material that restricts passage of the fusion material.
2. The transducer according to claim 1, wherein an outer edge portion of the first fusion restriction layer is embedded in the first main fusion layer.

3. The transducer according to claim 1, wherein the first main fusion layer is disposed to embed a part of the first electrode sheet and not to expose the part of the first electrode sheet to the outside of the first main fusion layer in a region where the first fusion restriction layer does not exist.

4. The transducer according to claim 1, wherein the first fusion restriction layer is disposed without being joined to the first electrode sheet.

5. The transducer according to claim 1, wherein the first fusion restriction layer is formed of a material having a softening point higher than a softening point of the fusion material.

6. The transducer according to claim 5, wherein the first fusion restriction layer is a resin sheet.

7. The transducer according to claim 1, further comprising
a first leading wire, which is electrically connected to a part disposed outside the first main fusion layer by the first fusion restriction layer within the first electrode sheet.

8. The transducer according to claim 7, further comprising
a first sticking layer which consists of an electrically conductive joining material and sticks the first electrode sheet and the first leading wire in an electrically connected state in a region facing the first fusion restriction layer.

9. The transducer according to claim 7, wherein the transducer further comprises
a first connection protective layer covering the first electrode sheet and the first leading wire in a region facing the first fusion restriction layer.

10. The transducer according to claim 9, wherein the transducer further comprises
a first connection fusion layer, which is formed of a fusion material and disposed as at least a part of the first connection protective layer or joined as a separate member to the first connection protective layer, and joins the first electrode sheet and the first connection protective layer by fusion of the fusion material.

11. The transducer according to claim 7, wherein a conductive portion of the first leading wire is entangled with the first electrode sheet.

* * * * *